US007174293B2

(12) United States Patent
Kenyon et al.

(10) Patent No.: US 7,174,293 B2
(45) Date of Patent: Feb. 6, 2007

(54) AUDIO IDENTIFICATION SYSTEM AND METHOD

(75) Inventors: Stephen C. Kenyon, Fairfax, VA (US); Laura Simkins, Clarksburg, MD (US)

(73) Assignee: Iceberg Industries LLC, Fairfax, VA (US)

( * ) Notice: Subject to any disclaimer, the term of this patent is extended or adjusted under 35 U.S.C. 154(b) by 845 days.

(21) Appl. No.: 09/903,627

(22) Filed: Jul. 13, 2001

(65) Prior Publication Data

US 2002/0023020 A1 Feb. 21, 2002

Related U.S. Application Data

(63) Continuation-in-part of application No. 09/420,945, filed on Oct. 19, 1999.

(60) Provisional application No. 60/218,824, filed on Jul. 18, 2000, provisional application No. 60/155,064, filed on Sep. 21, 1999.

(51) Int. Cl.
*G10L 17/00* (2006.01)
(52) U.S. Cl. ...................... 704/231; 704/246
(58) Field of Classification Search ................ 704/270, 704/270.1, 275, 233, 236, 104.1; 455/563, 455/557, 409, 575.2, 11.1; 707/104.1; 702/75
See application file for complete search history.

(56) References Cited

U.S. PATENT DOCUMENTS

| | | | |
|---|---|---|---|
| 3,919,479 A | 11/1975 | Moon et al. | ................. 704/237 |
| 4,450,531 A | 5/1984 | Kenyon et al. | ................. 708/5 |
| 4,542,525 A * | 9/1985 | Hopf | ........................... 704/233 |

(Continued)

FOREIGN PATENT DOCUMENTS

WO  WO 02/065782 A1  8/2002

OTHER PUBLICATIONS

Steven W. Smith, The Scientist and Engineer's Guide to Digital Signal Processing, 1997, California Technical Publishing, p. 48, 49 and 368-372.*

(Continued)

*Primary Examiner*—David D. Knepper
(74) *Attorney, Agent, or Firm*—Katten Muchin Rosenman LLP

(57) ABSTRACT

A method and system for direct audio capture and identification of the captured audio. A user may then be offered the opportunity to purchase recordings directly over the Internet or similar outlet. The system preferably includes one or more user-carried portable audio capture devices that employ a microphone, analog to digital converter, signal processor, and memory to store samples of ambient audio or audio features calculated from the audio. Users activate their capture devices when they hear a recording that they would like to identify or purchase. Later, the user may connect the capture device to a personal computer to transfer the audio samples or audio feature samples to an Internet site for identification. The Internet site preferably uses automatic pattern recognition techniques to identify the captured samples from a library of recordings offered for sale. The user can then verify that the sample is from the desired recording and place an order online. The pattern recognition process uses features of the audio itself and does not require the presence of artificial codes or watermarks. Audio to be identified can be from any source, including radio and television broadcasts or recordings that are played locally.

122 Claims, 15 Drawing Sheets

U.S. PATENT DOCUMENTS

| | | | |
|---|---|---|---|
| 4,697,209 A | 9/1987 | Kiewit et al. ................. 725/19 |
| 4,739,398 A | 4/1988 | Thomas et al. ............... 725/22 |
| 4,843,562 A | 6/1989 | Kenyon et al. ............... 702/73 |
| 4,918,730 A * | 4/1990 | Schulze ...................... 704/233 |
| 4,959,850 A * | 9/1990 | Marui ......................... 455/563 |
| 5,019,899 A | 5/1991 | Boles et al. .................. 725/22 |
| 5,164,915 A | 11/1992 | Blyth |
| 5,436,653 A | 7/1995 | Ellis et al. .................... 725/22 |
| 5,437,050 A | 7/1995 | Lamb et al. .................. 725/22 |
| 5,511,000 A | 4/1996 | Kaloi et al. |
| 5,687,279 A | 11/1997 | Matthews |
| 5,708,477 A | 1/1998 | Forbes et al. ................ 348/552 |
| 5,907,815 A * | 5/1999 | Grimm et al. ............... 455/557 |
| 5,963,957 A * | 10/1999 | Hoffberg ................ 707/104.1 |
| 6,049,710 A * | 4/2000 | Nilsson ...................... 455/409 |
| 6,188,985 B1 * | 2/2001 | Thrift et al. ................ 704/275 |
| 6,385,434 B1 * | 5/2002 | Chuprun et al. ........... 455/11.1 |
| 6,405,029 B1 * | 6/2002 | Nilsson ...................... 455/409 |
| 6,434,520 B1 * | 8/2002 | Kanevsky et al. .......... 704/243 |
| 6,453,252 B1 * | 9/2002 | Laroche ....................... 702/75 |
| 6,507,727 B1 | 1/2003 | Henrick |
| 6,510,325 B1 * | 1/2003 | Mack et al. .............. 455/575.2 |
| 6,519,564 B1 * | 2/2003 | Hoffberg et al. ......... 704/270.1 |
| 2002/0083060 A1 | 6/2002 | Wang et al. |
| 2002/0174431 A1 | 11/2002 | Bowman et al. |
| 2002/0181671 A1 | 12/2002 | Logan |

OTHER PUBLICATIONS

Sadaoki Furui, Digital Speech Processing, Synthesis, and Recognition, 189, Marcel Dekker, Inc., pp. 45-47 and 225-289.*

TIA/EIA Standard, TIA/EIA-627, 800 MHz Cellular System, TDMA Radio Interface, Dual-Mode Mobile Station-Base Station Compatipatibility Standard, Jun. 1996, pp. v, vi, 31-34, 57-60 and 68.*

Information Storage Devices, Inc., ISD1012A/1016A/1020A Single-Chip Voice Record/Playback Devices, Feb. 1992, pp. 1-15.

* cited by examiner

Figure 2: Typical Audio Capture Device

Figure 3: Signal Recognition System

Figure 4: Audio Interface and Signal Processor

Figure 5: Audio Spectrum Analysis and Feature Extraction

Figure 6: Audio Spectrum Analysis Bands

Figure 7: Example Feature Waveforms

Figure 8: Reference Feature Waveform Segmentation

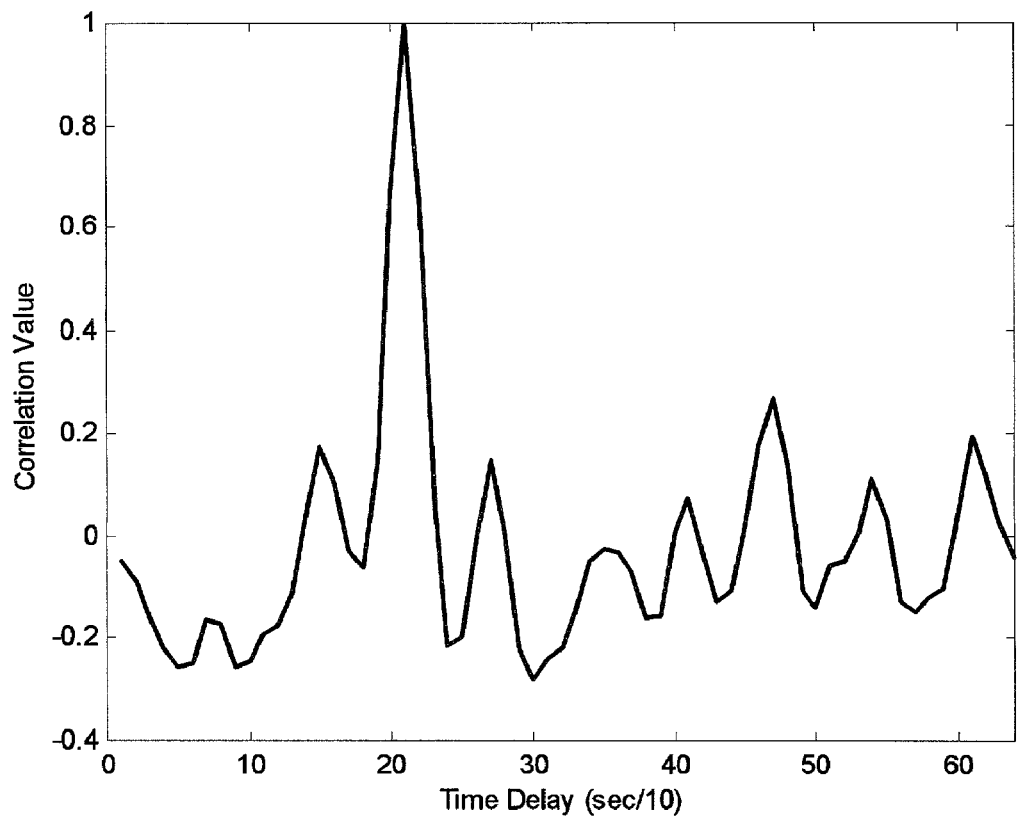
Figure 14: Example Feature Correlation Function

AUDIO IDENTIFICATION SYSTEM AND METHOD

This application claims priority to provisional patent Application No. 60/218,824, filed Jul. 18, 2000, and is a continuation-in-part of U.S. patent application Ser. No. 09/420,945, filed Oct. 19, 1999 (incorporated herein by reference), which claims priority to U.S. provisional patent Application No. 60/155,064, filed Sep. 21, 1999.

BACKGROUND OF THE INVENTION

1. Field of the Invention

The present invention relates to an apparatus and method for selectively capturing free-field audio samples and automatically recognizing these signals. The audio signals may be transmitted, for example, via cable or wireless broadcast, computer networks (e.g., the Internet), or satellite transmission. Alternatively, audio recordings that are played locally (e.g., in a room, theater, or studio) can be captured and identified. The automatic pattern recognition process employed allows users to select music or other audio recordings for purchase even though they do not know the names of the recordings. Preferably, the user uses a hand-held audio capture device to capture a portion of a broadcast song, and then uses the captured portion to access a site over the Internet to order the song.

2. Related Art

The need to identify audio broadcasts and recordings is a necessary step in the sales of compact discs, tapes and records. This has been made more difficult in many broadcast formats where the names of songs and artists are not provided by disc jockeys. To counter this problem, systems have been proposed that use a small electronic device to record the time that desired recordings are transmitted. These recorded time markers are then transmitted using the Internet to a web site that maintains logs of what songs were being transmitted on various broadcast stations. The users are then only required to know which broadcast stations they were listening to when the time was marked and stored. The assumption is that listeners typically stick to one or a few broadcast stations. A problem arises for listeners who frequently switch stations. An additional problem is the need to acquire and maintain logs from a potentially large number of stations. Radio and television stations may not always be willing to provide their air-play logs. As a result it may be necessary to construct these logs using manual or automatic recognition methods.

The need for automatic recognition of broadcast material has been established as evidenced by the development and deployment of a number of systems. The uses of the recognition information fall into several categories. Musical recordings that are broadcast can be identified to determine their popularity, thus supporting promotional efforts, sales, and distribution of media. The automatic detection of advertising is needed as an audit method to verify that advertisements were in fact transmitted at the times that the advertiser and broadcaster contracted. Identification of copyright protected works is also needed to assure that proper royalty payments are made. With new distribution methods, such as the Internet and direct satellite transmission, the scope and scale of signal recognition applications are increased.

Prospective buyers of musical recordings are now exposed to many more sources of audio than in the past. It is clearly not practical to create and maintain listings of all of these recordings from all of the possible audio sources indexed by time and date. What is needed is a methodology for capturing and storing audio samples or features of audio samples. Additionally, a method and a system are needed for automatically identifying these samples so that they can be offered by name to customers for purchase.

Automatic program identification techniques fall into the two general categories of active and passive. The active technologies involve the insertion of coded identification signals into the program material or other modification of the audio signal. Active techniques are faced with two difficult problems. The inserted codes must not cause noticeable distortion or be perceptible to listeners. Simultaneously, the identification codes must be sufficiently robust to survive transmission system signal processing. Active systems that have been developed to date have experienced difficulty in one or both of these areas. An additional problem is that almost all existing program material has not been coded.

Passive signal recognition systems identify program material by recognizing specific characteristics or features of the signal. Usually, each of the works to be identified is subjected to a registration process where the system learns the characteristics of the audio signal. The system then uses pattern matching techniques to detect the occurrence of these features during signal transmission. One of the earliest examples of this approach is presented by Moon et al. in U.S. Pat. No. 3,919,479 (incorporated herein by reference). Moon extracts a time segment from an audio waveform, digitizes it and saves the digitized waveform as a reference pattern for later correlation with an unknown audio signal. Moon also presents a variant of this technique where low bandwidth amplitude envelopes of the audio are used instead of the audio itself. However, both of Moon's approaches suffer from loss of correlation in the presence of speed differences between the reference pattern and the transmitted signal. The speed error issue was addressed by Kenyon et al. in U.S. Pat. No. 4,450,531 (incorporated herein by reference) by using multiple segment correlation functions. In this approach the individual segments have a relatively low time-bandwidth product and are affected little by speed variations. Pattern discrimination performance is obtained by requiring a plurality of sequential patterns to be detected with approximately the correct time delay. This method is accurate but somewhat limited in capacity due to computational complexity.

An audio signal recognition system is described by Kenyon et al. in U.S. Pat. No. 4,843,562 (incorporated herein by reference) that specifically addresses speed errors in the transmitted signal by re-sampling the input signal to create several time-distorted versions of the signal segments. This allows a high resolution fast correlation function to be applied to each of the time warped signal segments without degrading the correlation values. A low resolution spectrogram matching process is also used as a queuing mechanism to select candidate reference patterns for high resolution pattern recognition. This method achieves high accuracy with a large number of candidate patterns.

Lamb et al. describe an audio signal recognition system in U.S. Pat. No. 5,437,050 (incorporated herein by reference). Audio spectra are computed at a 50 Hz rate and are quantized to one bit of resolution by comparing each frequency to a threshold derived from the corresponding spectrum. Forty-eight spectral components are retained representing semi-tones of four octaves of the musical scale. The semi-tones are determined to be active or inactive according to their previous activity status and comparison with two thresholds. The first threshold is used to determine if an inactive semitone should be set to an active state. The second threshold is set to a lower value and is used to select active semi-tones that should be set to an inactive state. The purpose of this hysteresis is to prevent newly occurring semi-tones from dominating the power spectrum and forcing other tones to an inactive state. The set of 48 semitone states forms an activity vector for the current sample interval. Sequential vectors are grouped to form an activity matrix that represents the time-frequency structure of the audio. These activity matrices are compared with similarly constructed reference patterns using a procedure that sums bit matches over sub-intervals of the activity matrix. Sub-intervals are evaluated with several different time alignments to compensate for speed errors that may be introduced by broadcasters. To narrow the search space in comparing the input with many templates, gross features of the input activity matrix are computed. The distances from the macro features of the input and each template are computed to determine a subset of patterns to be further evaluated.

Each of the patents described above addresses the need to identify broadcast content from relatively fixed locations. What is needed for automated music sales is a method and apparatus for portable capture and storage of audio samples or features of audio samples that can be analyzed and identified at a central site. Additionally, a method and apparatus are needed for transmitting said samples to the central site and executing sales transactions interactively.

SUMMARY OF THE INVENTION

It is an object of the present invention to overcome the problems and limitations described above and to provide a method and system for capturing a plurality of audio samples, optionally extracting features of the audio, and storing the audio samples or audio features within a small handheld device. It is an additional object of the present invention to provide a method and system for transmission of said samples to a central location for identification using pattern recognition techniques. It is an additional object of the present invention to provide a method and system for recognizing audio data streams with high accuracy. It is still an additional object of the present invention to provide a method and system to facilitate the interactive acceptance and processing of orders for the purchase of musical recordings.

In one aspect of the present invention, recognizing free-field audio signals is accomplished by structure and/or steps whereby a hand-held device having a microphone captures free-field audio signals. A local processor, coupleable to the hand-held device, transmits audio signal features corresponding to the captured free-field audio signals to a recognition site. One of the hand-held device and the local processor includes circuitry which extracts a time series of spectrally distinct audio signal features from the captured free-field audio signals. A recognition processor and a recognition memory are disposed at the recognition site. The recognition memory stores data corresponding to a plurality of audio templates. The recognition processor correlates the audio signal features transmitted from the local processor with at least one of the audio templates stored in the recognition processor memory. The recognition processor provides a recognition signal based on the correlation.

In another aspect of the present invention, structure and/or steps for a hand-held device to capture audio signals to be transmitted from a network computer to a recognition site, the recognition site having a processor which receives extracted feature signals that correspond to the captured audio signals and compares them to a plurality of stored song information, includes structure and steps for: (i) receiving analog audio signals with a microphone; (ii) A/D converting the received analog audio signals to digital audio signals; (iii) extracting spectrally distinct feature signals from the digital audio signals with a signal processor; (iv) storing the extracted feature signals in a memory; and (v) transmitting the stored extracted feature signals to the network computer through a terminal.

According to yet another aspect of the present invention, a recognition server in an audio signal recognition system having a hand-held device and a local processor, the hand-held device capturing audio signals and transmitting to the local processor signals which correspond to the captured audio signals, the local processor transmitting extracted feature signals to the recognition server, includes structure and/or steps for receiving the extracted feature signals from the local server through an interface, and storing a plurality of feature signal sets in a memory, each set corresponding to an entire audio work. Processing circuitry and/or steps are provided for (i) receiving an input audio stream and separates the received audio stream into a plurality of different frequency bands; (ii) forming a plurality of feature time series waveforms which correspond to spectrally distinct portions of the received input audio stream; (iii) storing in the memory the plurality of feature signal sets which correspond to the feature time series waveforms, (iv) comparing the received feature signals with the stored feature signal sets, and (v) providing a recognition signal when the received feature signals match at least one of the stored feature signal sets.

In another aspect of the present invention, apparatus and/or method for recognizing an input data stream, includes structure and/or function for: (i) receiving the input data stream with a hand-held device; (ii) with the hand-held device, randomly selecting any one portion of the received data stream; (iii) forming a first plurality of feature time series waveforms corresponding to spectrally distinct portions of the received data stream; (iv) transmitting to a recognition site the first plurality of feature time series waveforms; (v) storing a second plurality of feature time series waveforms at the recognition site; (vi) at the recognition site, correlating the first plurality of feature time series waveforms with the second plurality of feature time series waveforms; and (vii) designating a recognition when a correlation probability value between the first plurality of feature time series waveforms and one of the second plurality of feature time series waveforms reaches a predetermined value.

In a further aspect of the present invention, the title and performer of the recognized audio is provided to the user who originally captured the audio sample. The user may then be offered the option of purchasing a recording of the recognized audio.

BRIEF DESCRIPTION OF THE DRAWINGS

Other advantageous features of the present invention will be readily understood from the following detailed description of the preferred embodiments of the present invention when taken in conjunction with the attached Drawings in which:

FIG. 14 is an example of a feature correlation function containing a detection event.

DETAILED DESCRIPTION OF THE PRESENTLY PREFERRED EXEMPLARY EMBODIMENT

1. Overview

Figure 1:
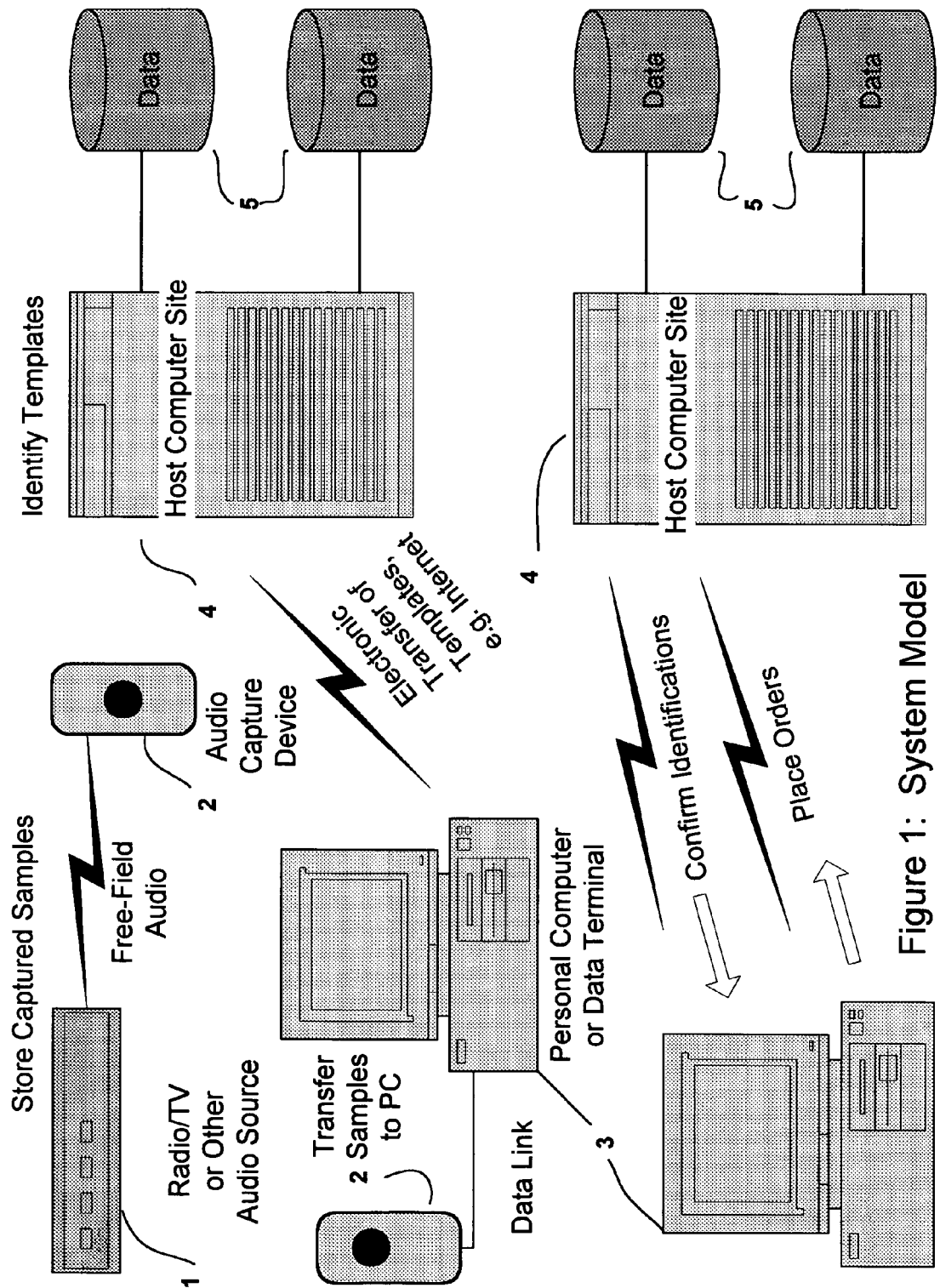
FIG. 1 illustrates a system model of the operation of the audio capture and identification system.

The preferred embodiment is directed to a technology and system for audio sample capture and the automatic identification of signals using a method known as passive pattern recognition. As contrasted with active signal recognition technology, which injects identification codes into the recorded material, the passive approach uses characteristics or features of the recording itself to distinguish it from other possible audio inputs. While both methods have their advantages, passive approaches are most appropriate for audio sample identification. There are several reasons for this. First, coded identification signals that are added to the audio material in active systems are frequently detectable by a discerning ear. When the code injection level is reduced to the point that it is inaudible, the reliability of the code recovery suffers. Further, the injected codes are often destroyed by broadcast processing or signal processing necessary to distribute audio on computer networks. However, the most important shortcoming of the active technologies is that there are millions of works in distributions that have not been watermarked. This material cannot be identified; only new releases that have been processed to inject codes can be detected automatically using active techniques. Active techniques are therefore not appropriate for audio sample capture using a small portable device and subsequent automatic identification.

In contrast, passive pattern recognition systems learn the distinctive characteristics of each audio recording. During a training procedure, works that are to be identified are analyzed and features of the audio are processed into templates to be recognized later. These templates are stored at a central recognition site. Unknown audio samples that are captured by users are then transferred to the central site for analysis and comparison with the features of each known pattern. Note that it is possible to transfer the audio samples themselves or to compute and transfer only the features of the audio samples. When the properties of the unknown audio sample match one of the template sets stored in a database, the unknown sample is declared to match the work that was used to produce the corresponding templates. This is analogous to fingerprint or DNA matching. By properly selecting the features of the audio that are used to construct the stored templates this process can be extremely reliable, even in cases where the signal has been significantly degraded and distorted by environmental noise. The system can, of course, learn to recognize any work, old or new.

In most implementations of passive signal recognition technology, the templates stored in the database are derived from a single time interval of a recording that may range from several seconds to a minute in duration. The system then monitors each input channel continuously, searching for a match with one of the templates in the database. In this configuration the system has only learned a small piece of each recording that it must recognize. As the system searches for audio pattern matches from its input channels, it must repeatedly acquire signal segments and compare them with database entries. The system must continuously monitor each of its input channels. Otherwise, a time segment that matches one of the database templates could occur when the system is not monitoring a particular channel. Clearly this approach is not suitable for an application where a consumer wishes to capture only a short sample of a recording for subsequent automatic identification.

The preferred embodiment according to the present invention is designed differently. Instead of learning a single time segment from each audio recording, all of the time segments comprising each work are learned and stored in a pattern database. While this increases the size of the pattern database, the size is not unreasonable. Signal recognition is accomplished from a single input signal sample block. Once an audio sample block has been captured and stored, it is compared with all stored templates from all recordings in the database.

The recognition system architecture according to the present invention is a distributed network of specially equipped computers. This network can grow in a uniform way to expand the number of input ports or the number of audio recordings in the database. Audio samples or features are delivered to the recognition system via the Internet or other similar means. These audio samples are captured from free-field audio from virtually any source. These sources include Internet transmission of audio recordings, broadcast, or locally played recordings. Regardless of the signal source, the pattern recognition processes involved are the same.

The present invention utilizes an initialization or registration process to produce templates of recordings that are later to be identified. In this process, audio signals are digitized and processed to extract sequences of important features. These features generally represent measurements of energy present in different portions of the audio spectrum. Sequences of these measurements comprise time series data streams that indicate the dynamic structure of the signal. The multiple feature streams are then broken into overlapping time intervals or segments of several seconds each that cover the entire recording. The audio features from each segment are analyzed to determine which features carry the most descriptive information about the segment. Features are then rank-ordered according to their information content, and the best features are selected to construct a template of a particular segment. Note that each segment may use a different subset of available features, and they may be ordered differently within each segment. The features are then normalized and fast Fourier transformed to produce complex spectra that facilitate fast feature correlation. In addition, each feature is correlated with a large number of similar features stored in the pattern library. This allows us to estimate the standard deviation of correlation values when the segment is not present in the input stream. From this we can predict the probability that a particular peak correlation value occurred randomly. The rank-ordered features, normalization factors, and feature standard deviations are stored as structured records within a database entry representing the entire work.

The signal recognition process operates on unknown audio signals by extracting features in the same manner as was done in the initialization process. However, instead of capturing the entire work, it is only necessary to acquire a single snapshot or time sample equal in duration to that of a template segment; in the present embodiment, about 6 seconds. All available features are computed from the unknown audio sample. Note that the feature extraction can be performed in the portable sampling device or at the central site. For each time segment of each pattern in the database the most descriptive feature is correlated with the corresponding feature measurement from the unknown input signal. Based on the peak value of the correlation function and the standard deviation of background correlations computed during initialization, an estimate is made of the probability that the correlation occurred randomly. If the probability is low enough, the pattern is placed on a candidate list. Patterns on the candidate list are then further evaluated by correlating the next most valuable feature of each pattern segment on the candidate list with the corresponding features of the unknown input. The probability of random (false) correlation is then estimated for this feature as well. Assuming statistical independence of the two feature correlations, the probability that the two events happened randomly is the product of the individual probabilities. This process is repeated using additional features until the probability that a detection event occurred at random is low enough that there is confidence that the detection is legitimate. Patterns on the candidate list that exceed the probability of false detection threshold are deleted.

This iterative process of evaluating additional features results in a drastic reduction in the computational load. For example, assume that for each feature correlation, only five percent of the candidate patterns produce false alarm probabilities below the threshold for further consideration. Then, 95% of the candidates will be disregarded on each feature correlation pass. If we use four features, the total number of correlations $N_c$ that must be computed is $$N_c=(1+0.05+(0.05)^2+(0.05)^3)*N_p \quad (1)$$

where $N_p$ is the total number of patterns in the database. In this case $N_c=1.052625*N_p$. The use of four features requires only slightly more computation than a single feature. By comparison, if this iterative rejection of candidates was not used $N_c=4*N_p$ correlations would have been required. The savings in computation is substantial, and increases as more features are used. This allows the system to operate with a larger database searching for more patterns, or to process more identification requests using the same computational resources.

The preferred pattern recognition algorithm is based on computing cross correlation functions between feature time series data extracted from the unknown audio samples and reference patterns or templates derived from the signal to be identified. The performance of the correlation function is determined by the amount of information contained in the pattern. If there is too little information in the pattern, it will have a high false alarm rate due to random correlations exceeding the detection threshold. If there is too much information in the pattern, small variations or distortions of the input signal will degrade the value of the correlation peak causing detections to be missed. For the preferred embodiment, the information content of a pattern is equal to its time-bandwidth product. It has been found that a time-bandwidth product of 80–100 provides low false alarm rates while still being tolerant of distortion typical in a broadcast environment or environmental background noise. A pattern duration of 10 seconds would therefore need a bandwidth of 8–10 Hz to produce the desired performance. This bandwidth can be from a single information stream or from several separate streams with less bandwidth, provided that the individual streams are statistically independent. Similarly, several time segments of low bandwidth may be used to produce the needed time bandwidth product.

The correlation function or matched filter response can be implemented in the time domain by integrating the products of time series samples of the template and a corresponding number of samples of the unknown input series and then properly normalizing the result. However, the process should be repeated for each time delay value to be evaluated. The computational load, however, may not be acceptable. A better technique known as fast convolution is preferred that is based on the Fast Fourier Transform algorithm. Instead of directly computing each correlation value, an entire block of correlation values is computed as the inverse Fourier transform of the cross-power spectrum of the template time series and a block of input data samples. The result may be normalized by the product of the standard deviations of the input and the template. Furthermore, if correlations are to be computed continuously the template or reference pattern can be padded with zeros to double its length and the input data may be blocked into double length buffers. This process is repeated using overlapped segments of the input data and evaluating the values of the first half of the resulting correlation function buffers. In this method, the input stream is monitored continuously. Any occurrence of the reference pattern in the input stream will be detected in real time.

The method used in the preferred embodiment uses a fast correlation approach where the roles of template and input data are reversed. In this approach, a sequence of overlapped data buffers are acquired from the entire audio time series to be recognized during the initialization process. A set of templates is then created as the fast Fourier transform of the normalized data buffers. As is well known in signal recognition technology, a post correlation normalization may be used to adjust for the signal power present in the portion of the template where the input block occurs. To accomplish this, a set of RMS amplitude values is computed for each of the possible time delays. These values are computed and stored in the pattern data structure during initialization.

In the recognition process, a block of feature data from the unknown audio sample is acquired from the input stream and normalized to a fixed total power. It is then zero-filled to double its length and Fourier transformed to produce a complex spectrum. The input spectrum is then vector-multiplied by each of the template spectra. The resulting cross power spectra are then inverse Fourier transformed to produce a set of correlation functions. These raw correlation functions are then normalized by dividing each value in the correlation by the corresponding RMS value stored in the pattern data structure. The correlation values range from 1.0 for a perfect match to 0.0 for no match to −1.0 for an exact opposite. Further, the mean value of these correlations will always be 0.0. By computing correlation functions for multiple features and combining them according to their statistical properties, an efficient and accurate method of recognizing multivariate time series waveforms is provided.

The method of the present invention uses multiple feature streams extracted from the audio. This allows the template generation and the recognition process to be tailored to the most distinctive aspects of each recording. In addition, the pattern recognition process is staged to conserve processing capacity. In this approach, an initial classification is performed using only one or two features. For each feature correlation that is evaluated within a particular time segment, the system estimates the probability that such an event could occur randomly. Candidate patterns with a low probability of random occurrence are examined further by computing the correlation with an additional feature. Correlation peaks are matched within a time window and the probability that the new feature correlation occurred randomly is estimated. The system then computes the probability of simultaneous random correlation as the product of the individual probabilities (assuming statistical independence). If this joint probability is below a predetermined detection threshold, it is determined that the event represents a valid recognition and the detection is reported. If the joint probability is above a separate predetermined rejection threshold, the event is deemed to be a false alarm and the pattern is no longer considered a candidate for recognition. Otherwise, an additional feature correlation is computed and the joint probability is updated to include the new feature information.

This process is repeated until a decision has been made or all features have been evaluated. The basis for relating correlation values to probabilities is the standard deviation of feature correlations between pattern templates and a large database of similar features extracted from different recordings stored in the pattern database. This is performed during initialization of each recording. Since these correlations have approximately a normal distribution, the cumulative distribution function can be used to estimate the probability that a particular correlation value occurred randomly.

The pattern recognition system is driven to a large degree by the structure of the pattern database. In order to support a variety of operational modes and signal types, a pattern data structure has been devised that is hierarchical and self-descriptive. Since the system must be capable of identifying randomly selected audio samples, a generalized representation of feature streams has been devised that allows the most effective features to be used for each segment. Other segments of the same recording may use completely different feature sets. One aspect that is common to all features is that they are preferably represented as a time series of measurements of certain characteristics of the audio.

A reference pattern is preferably structured as a three-layer hierarchy. At the top level the pattern identification code and pattern type are indicated in the first two words. The third word indicates the number of time segments in the pattern. Next is a list of pointers to segment descriptor blocks followed by a checksum to assure block integrity.

Each segment descriptor block carries forward the pattern identification code and the pattern type as the first two words in the block header. Next is the segment number indicating which time interval is represented. The fourth word indicates the number of features in the current segment block. Next is a list of pointers to feature data blocks followed by a checksum.

The third level in the hierarchy is the feature data block level. In addition to header information, these blocks actually contain pattern feature data. The first three words carry the pattern identification code, pattern type and the segment number as was the case in the segment descriptor block. The fourth word in the feature data block indicates the feature type. The feature type word is used to select which feature stream from the input is to be compared with this block. Next is a scale factor that is used to adjust the relative gain among features to maintain precision. This is used since the feature time series data are preferably normalized to preserve dynamic range. The standard deviation of background (false alarm) correlations is stored along with detection and rejection probability thresholds. Next in the feature data block is a frequency domain matched filter derived from the normalized feature data. (Correlation and matched filtering are mathematically equivalent operations where the "template" and "filter" are substantially the same thing. In the preferred embodiment, templates are stored as complex spectra representing the amplitude and phase response. The maximum output value occurs when the spectrum of the unknown input is the complex conjugate of the template at every frequency.) The feature normalization array is stored next in compressed form. At the end of the block is a checksum, again to assure data structure integrity.

In addition to the signal feature data structures that are stored in the reference pattern database are a set of structures that provide information about the work itself such as the name, type, author, and publisher of each work. Various industry standard identification codes such as ISWC (International Standard Musical Work Code), ISRC (International Standard Recording Code), and ISCI (International Standard Coding Identification) are stored in the pattern database. Also included in this structure may be the media source type, work duration, and the date and time of pattern initialization. These structures are indexed by the same Pattern ID code used to reference the signal feature data structures. The work description data are used to report information that is useful to users.

2. Structures and Functions

The preferred embodiment of the invention comprises a signal collection and identification system that is capable of capturing samples of a local audio environment 1 containing musical recordings or other audio sources. These sources may include conventional broadcast, satellite distribution feeds, internet and data distribution networks, and various subscription services. Users of the system carry a small digital recording device 2 that allows audio samples to be digitized and stored in a local memory. Optionally, recognition features are extracted, compressed, and stored in the digital recording device 2 instead of the audio waveform, to conserve memory. Later, the user transfers these audio samples or audio features using a personal computer 3 or other electronic means to a recognition facility 4 where they are identified. Once a sample has been identified as being part of a recording that is contained in the recognition system database 5, the corresponding recording is played for the user so that the user can confirm that the recording is, in fact, the one that the user has sampled. If the user confirms the identification, the system offers the opportunity to purchase the recording in an on-line or interactive manner. A purchased recording may be provided from local retail stock, shipped from a central warehouse, or transferred electronically. These operations and procedures are illustrated in FIG. 1. In FIG. 1, a brief free-field sound sample from an audio source such as a radio, television receiver, a CD player, a personal computer, a phonograph player, etc. is captured by a small hand-held device and is stored in a digital memory. Captured samples of the audio or audio features are later loaded into a personal computer that is connected to a host site containing reference patterns derived from music offered for sale. An audio identification system located at the host site then identifies the samples and transmits the names of the corresponding recordings and returns these names and a brief sound clip to the user for confirmation. The user is then offered the opportunity to purchase the recording.

Figure 2:
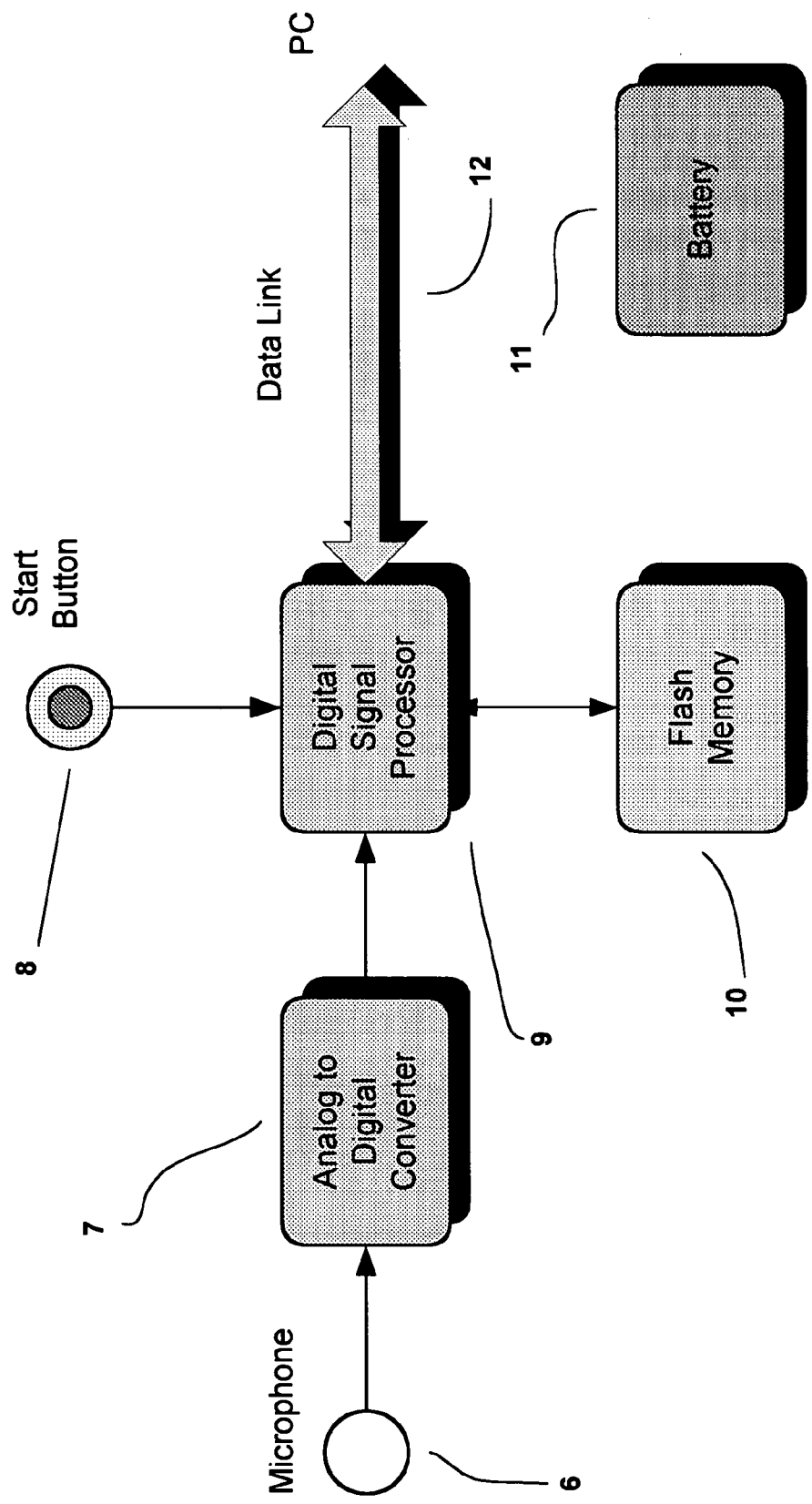
FIG. 2 shows the components of an audio capture device used to acquire samples of audio for transmission to the host site.

A typical audio capture device is shown in FIG. 2. This device may be separate or may be embedded in other electronic devices such as cellular telephones, PDA's (personal digital assistants like Palm Pilots™, or any type of portable radio receiver. The preferred embodiment of the audio capture device includes a small microphone 6 to acquire the audio signal and an analog to digital converter 7 that includes necessary signal conditioning such as pre-amplifiers and anti-aliasing filters. The output of the analog to digital converter 7 comprises a digital time series representing the voltage waveform of the captured audio signal. When a user hears a song that he or she would like to identify for possible purchase, a start button 8 is depressed to begin capture of the audio sample. A fixed duration sample block from the analog to digital converter 7 is then transferred to digital signal processor 9. The digital signal processor 9 may then format and label the captured audio block for storage in a non-volatile memory such as flash memory 10. Alternatively, the digital signal processor 9 may perform feature extraction and store only the highly compressed recognition features in flash memory 10. Since the audio capture device is only active during the signal acquisition and storage processes, it can be powered by a small battery 11 with long battery life expectations. The captured audio samples or audio feature samples are later transferred to a personal computer using data link 12. This data link may be any of the common standards such as RS-232, IEEE-1394, USB, or IrDA.

Figure 3:
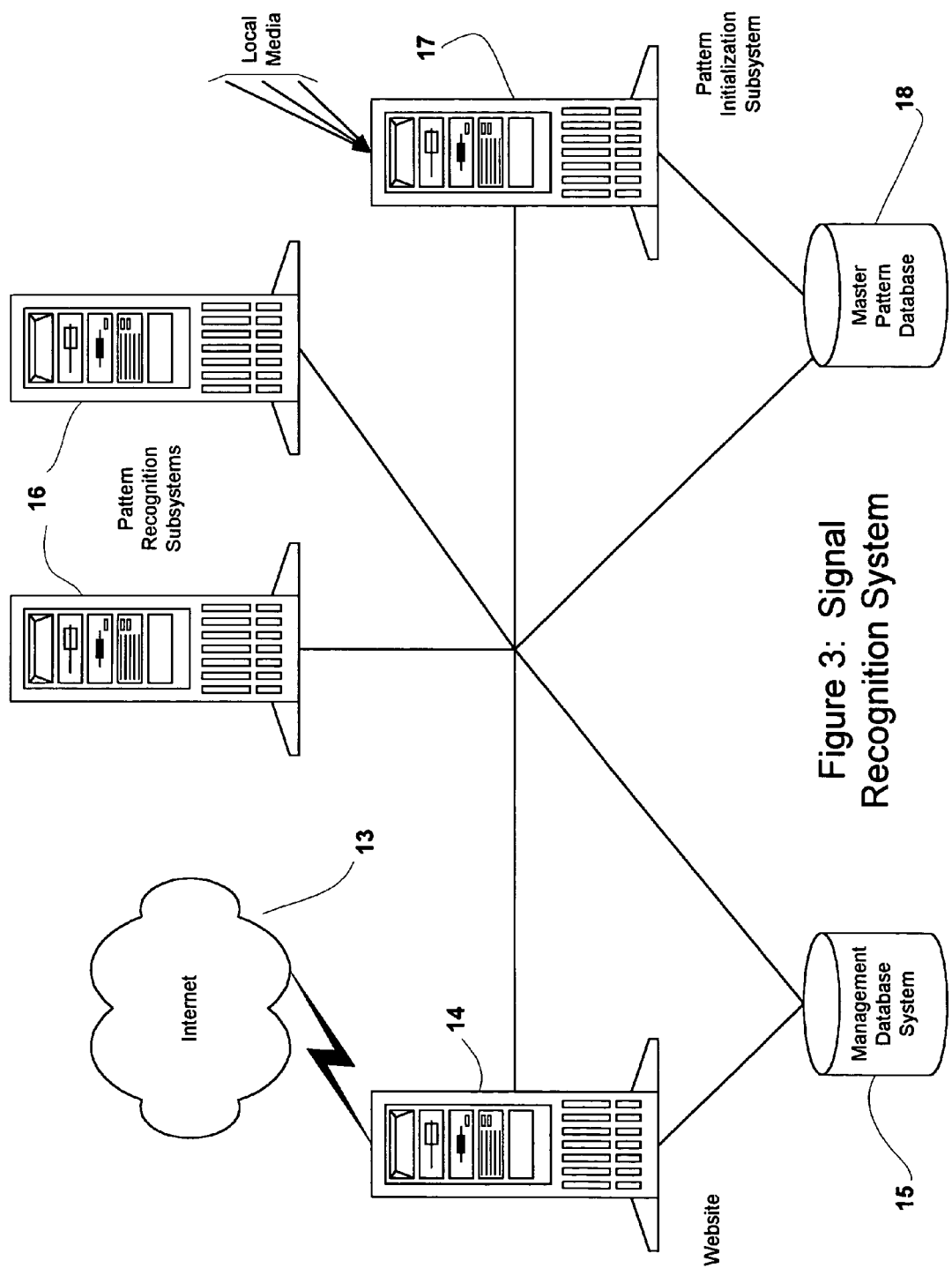
FIG. 3 illustrates the components of the remote sites that are used to perform audio signal identifications

To accomplish the audio identification, the audio samples or audio feature samples are transferred to a host site as illustrated in FIG. 3, preferably using the Internet 13. FIG. 3 shows the components of the remote sites that are used to perform audio signal identifications. These may include the website host, pattern recognition subsystems, a pattern initialization system for generating reference patterns from recordings, and the necessary databases. The preferred exemplary embodiment of the host site is configured as a distributed network of computer subsystems where each subsystem has specific functions. Users communicate via the Internet 13 with a website 14 and transmit their audio samples for identification. These samples are in turn transferred from the website 14 to one or more pattern recognition subsystems 16. The pattern recognition subsystems 16 then compare the features of the user-supplied audio samples with similar feature data stored in a master pattern database 18. In order to create reference patterns, one or more pattern initialization subsystems 17 process audio signals from physical media or electronic sources to create templates of audio feature vectors. These are formatted and stored in the master pattern database 18. When audio samples from the user are matched with templates in the master pattern database 18, the detection results are indexed with corresponding data in the management database system 15 such as the name of the song and the artist. This information is transmitted through the website 14 to the user using the Internet 13.

The pattern initialization subsystems 17 accept complete audio works that are to be entered into the master pattern database 18. These subsystems perform feature extraction in the same manner as in the audio sample capture processing. However, instead of constructing brief packets of features for identification, the initialization subsystems 17 extract continuous feature waveforms from the entire work. The feature waveforms are then broken into overlapping time-series segments and processed to determine which features should be used for signal recognition and in what order. The resulting reference pattern data structures are stored in the master pattern database 18. These patterns are subsequently transferred to the pattern recognition subsystems 16 for comparison with the unknown input feature packets.

Figure 4:
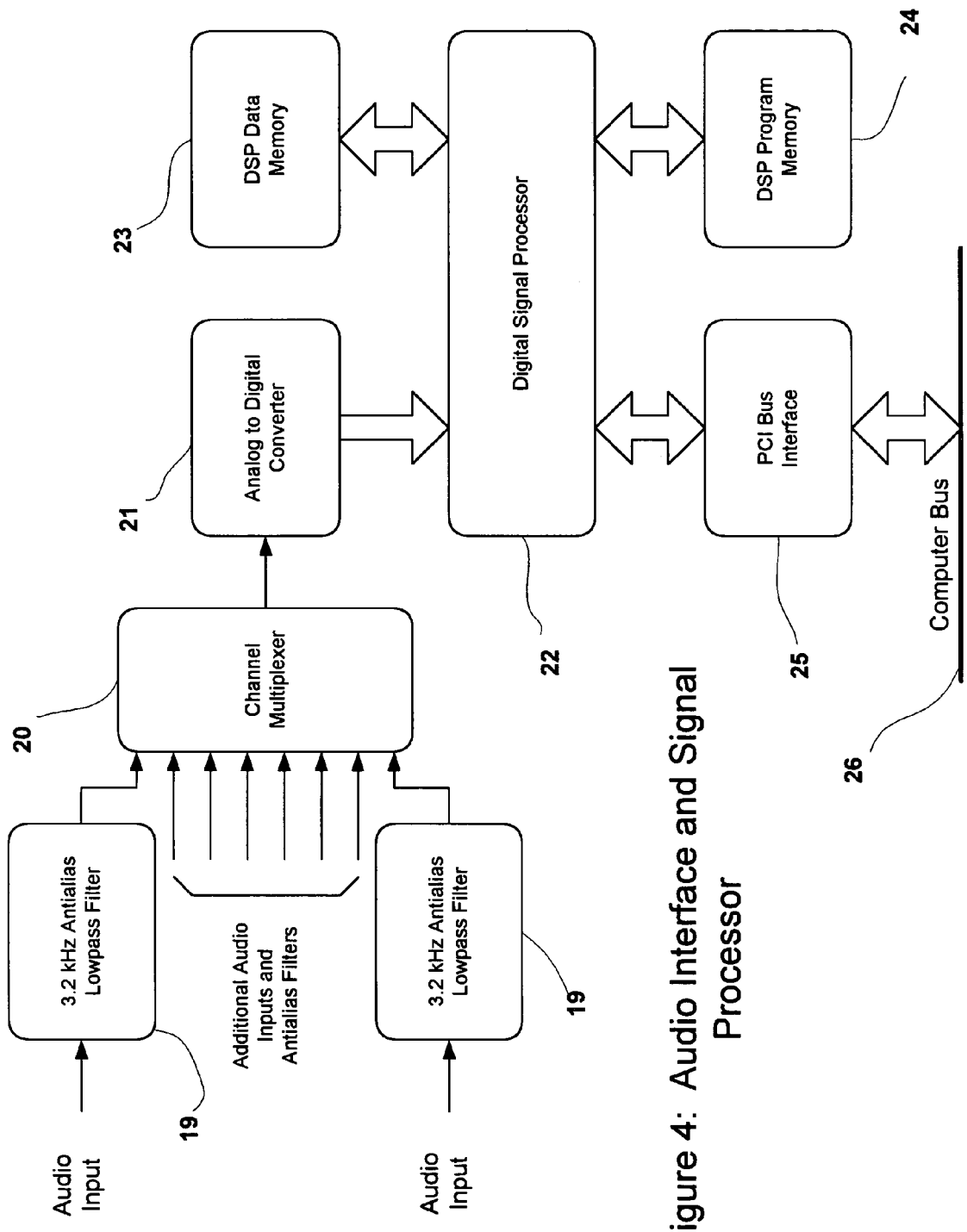
FIG. 4 is a diagram of the audio interface and signal processor that is used in the pattern initialization system according to a preferred embodiment to acquire audio at the host site and extract features for use in reference pattern generation.

The website computer(s) 14 interacts with users who may transmit audio samples or audio feature blocks for identification. If feature extraction has been performed in the audio capture device, the feature blocks may be transferred directly to pattern recognition subsystems 16 for identification. Otherwise, the feature extraction process is performed using an audio interface and signal processor board as illustrated in FIG. 4. Note that this type of signal processor is also used in the pattern initialization subsystem 17 to extract features for generation of reference patterns for storage in the master pattern database.

The pattern initialization subsystem comprises a host computer and one or more specialized signal processor circuit boards that perform the actual feature extraction. The audio interface and signal processor according to the preferred embodiment is illustrated in FIG. 4. In this example, up to eight audio sources can be simultaneously processed. In this way, multiple workstations can be supported for adding entries to the database. Analog audio inputs are connected to analog anti-alias lowpass filters 19 to restrict the maximum audio frequency (to 3.2 kHz in this example). The outputs of these filters are connected to a channel multiplexer 20 that rapidly scans the filter outputs. In this example with eight channels sampled at 8 kHz each, the channel multiplexer 20 switches at a 64 kHz rate. The channel multiplexer output is connected to an analog to digital converter 21 that operates at the aggregate sample rate producing a multiplexed time series of the selected sources.

The output of the analog to digital converter 21 is transmitted to a programmable digital signal processor 22 that performs the digital processing of the audio time series waveforms to extract features and construct the feature packets that are to be recognized. Digital signal processor 22 may comprise a special purpose microprocessor that is optimized for signal processing applications. It is connected to a program memory 24 (where programs and constants are stored) and a data memory 23 for storage of variables and data arrays. The digital signal processor 22 also connects to the host computer bus 26 using an interface such as the PCI bus interface 25 for exchange of data between the digital signal processor and the host computer. Note that in cases where digitized audio is available for feature extraction, these data are transferred directly from the host computer bus 26 via the PCI bus interface 25 to the digital signal processor 22, bypassing anti-alias lowpass filters 19, channel multiplexer 20, and analog to digital converter 21.

Figure 5:
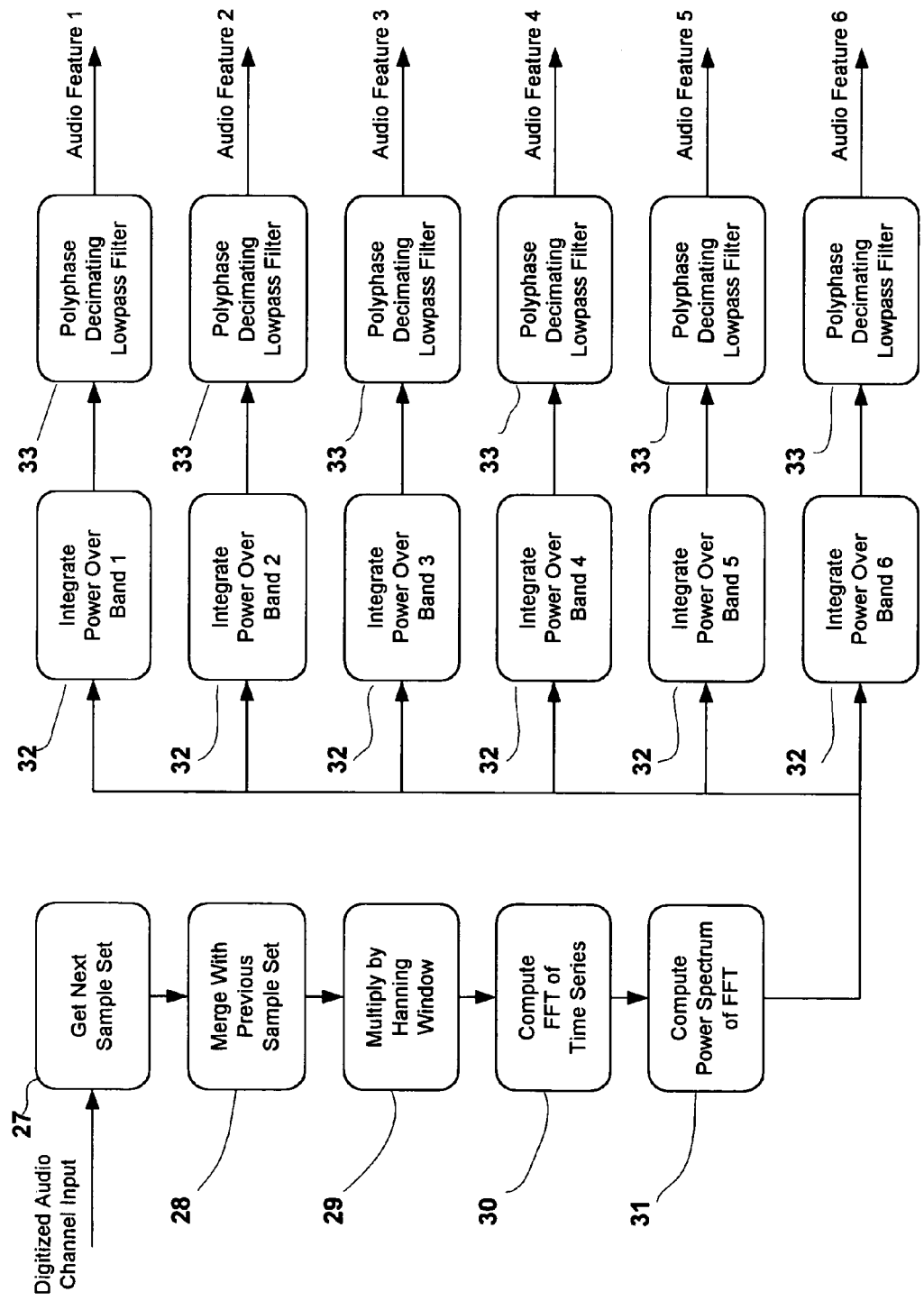
FIG. 5 depicts the preferred processes for extracting features from audio waveforms.

The audio signal processing necessary to perform the feature extraction is preferably performed in software or firmware installed on digital signal processor 22, as depicted in FIG. 5. FIG. 5 depicts the preferred processes for extracting features from audio waveforms. These processes include computing sequences of power spectra, integrating spectral power over several frequency bands, and decimating the integrated spectral power sequences to form a set of low bandwidth feature time series. Digitized audio samples from one of the signal sources are grouped into a sample set 27 and merged with one or more previous sample sets 28 to form a window into the audio time series for periodic spectral analysis. The size of this window determines the spectral resolution while the size of the new sample set 27 determines the interval between updates. Once a block of data has been prepared for analysis, it is multiplied by a function such as a Hanning window 29 to reduce the spectral leakage due to so-called end-effects caused by finite block size. The resultant time series is then processed by a Fast Fourier Transform (FFT) 30 to produce the complex spectrum. The power spectrum 31 is then calculated from the complex spectrum by summing the squares of the real and imaginary components of each frequency bin.

Figure 6:
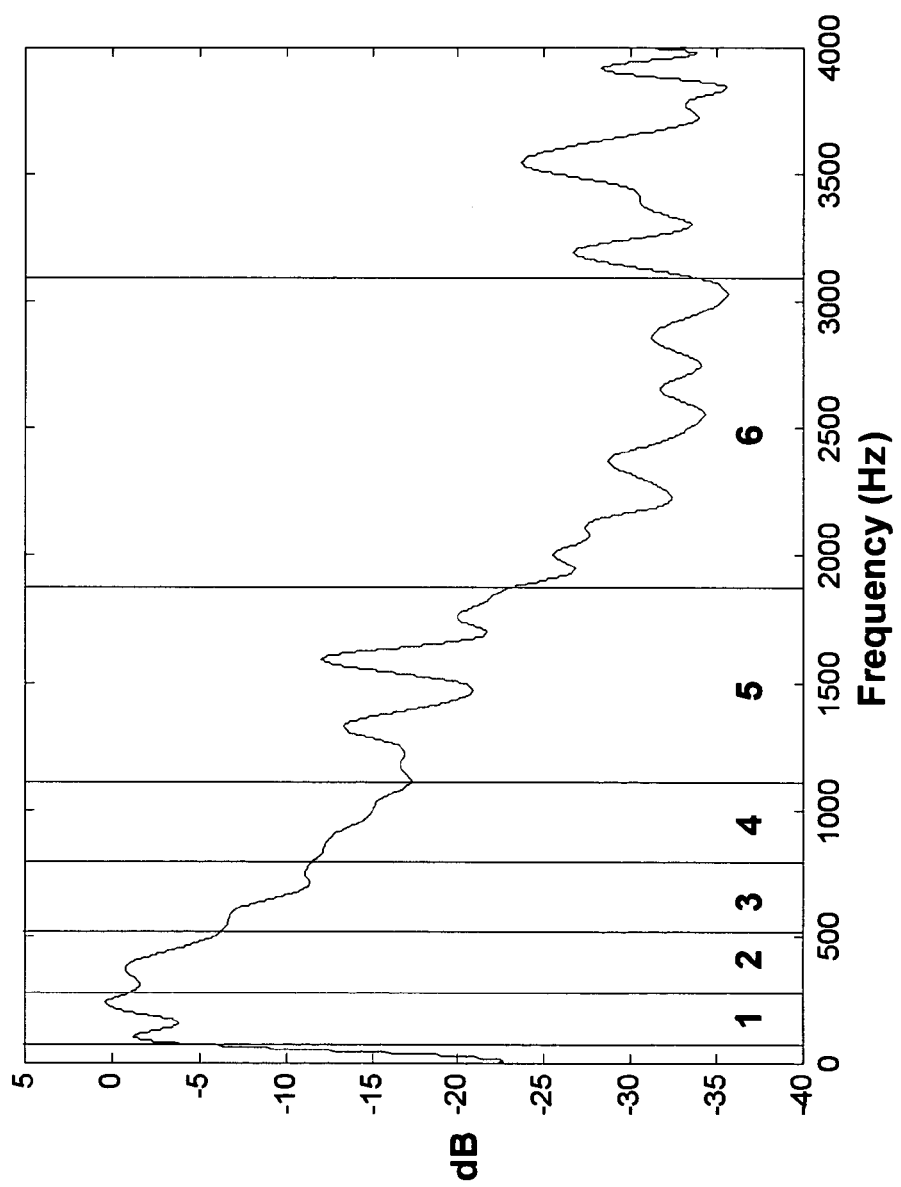
FIG. 6 illustrates a typical audio power spectrum and the partitioning of this spectrum into several frequency bands.

An example of the resulting audio power spectrum 31 is shown in FIG. 6. FIG. 6 illustrates a typical audio power spectrum and the partitioning of this spectrum into several frequency bands. Lower frequency bands are preferably narrower than the higher frequency bands to balance the total power in each band and to match the human auditory characteristics. This figure also indicates the partitioning of the spectrum into several frequency bands. The total power in each of the frequency bands is found by integrating the power contained in all of the frequency bins in the respective bands as shown in 32. Each time the above processes are performed, a new set of feature measurements is generated. In most cases the update rate will still be much higher than desired from the point of view of feature bandwidth and the resulting data rate. For this reason, the sample rate is reduced by processing each frequency band feature sequence by a polyphase decimating lowpass filter 33. In the preferred embodiment of the invention, this results in an audio feature sample rate of approximately 10 Hz.

Figure 7:
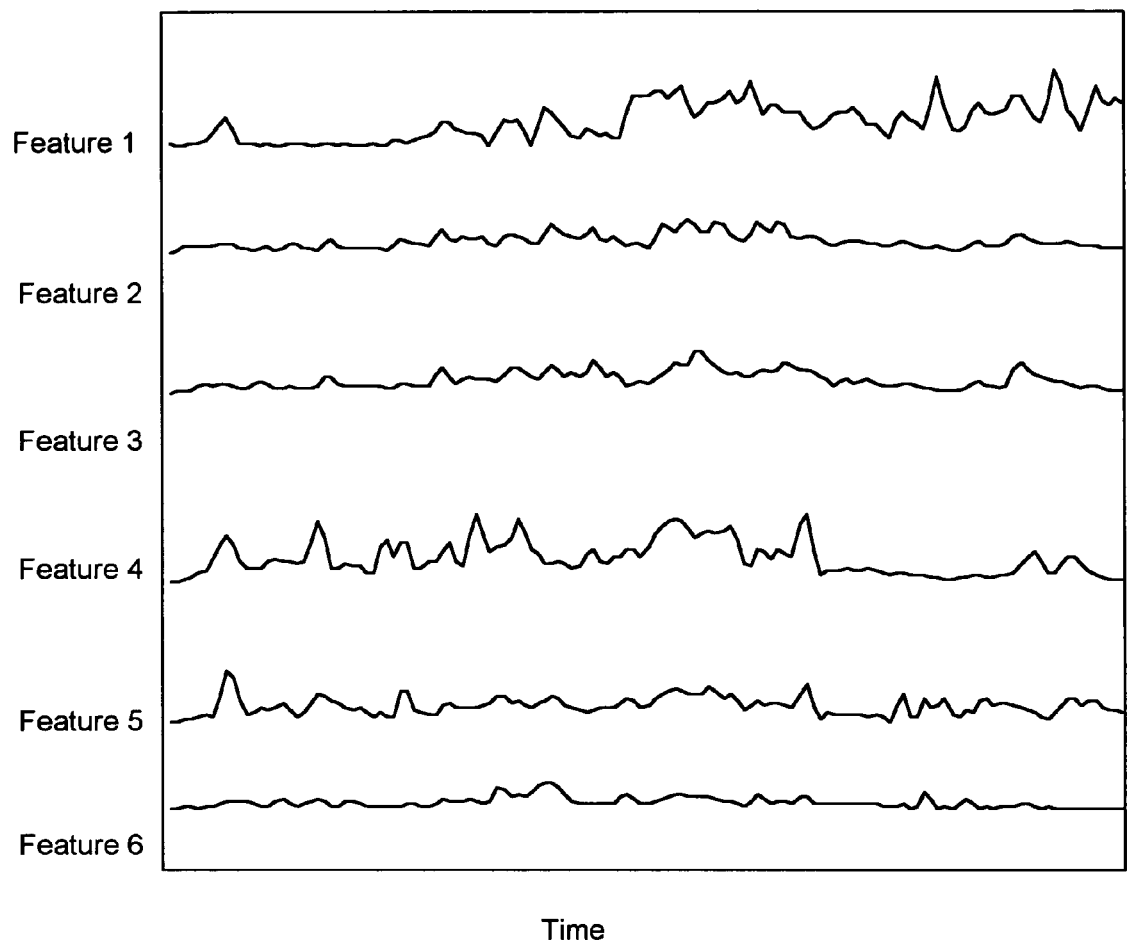
FIG. 7 illustrates several feature time series waveforms.
Figure 8:
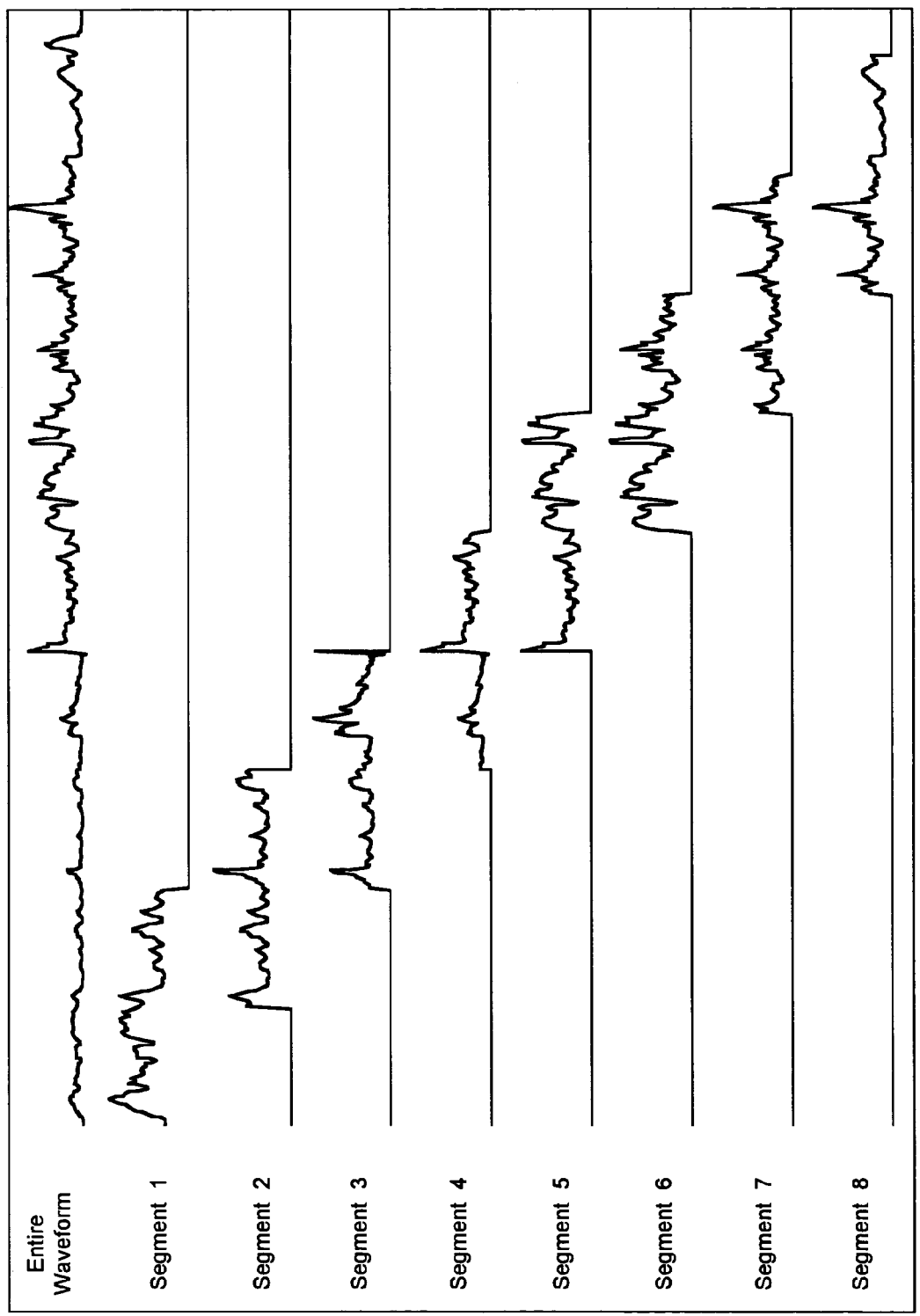
FIG. 8 illustrates the partitioning of a single feature waveform into overlapped segments.

FIG. 7 is an example of a set of feature waveforms extracted from an audio signal. In the case of the signal recognition process, a set of 64 consecutive samples is collected from each feature waveform to construct recognition feature packets. In constructing reference patterns, each feature waveform is broken into segments that are 128 samples long and are overlapped by 64 samples. This ensures that an unknown input sample feature packet will be completely contained in at least one of the feature reference segments. The overlapping segmentation of a single feature is illustrated in FIG. 8. This segmentation is applied to all available features. FIG. 8 illustrates the partitioning of a single feature waveform into overlapped segments. These segments are then normalized, processed, and stored in the pattern database for later recognition.

Figure 9:
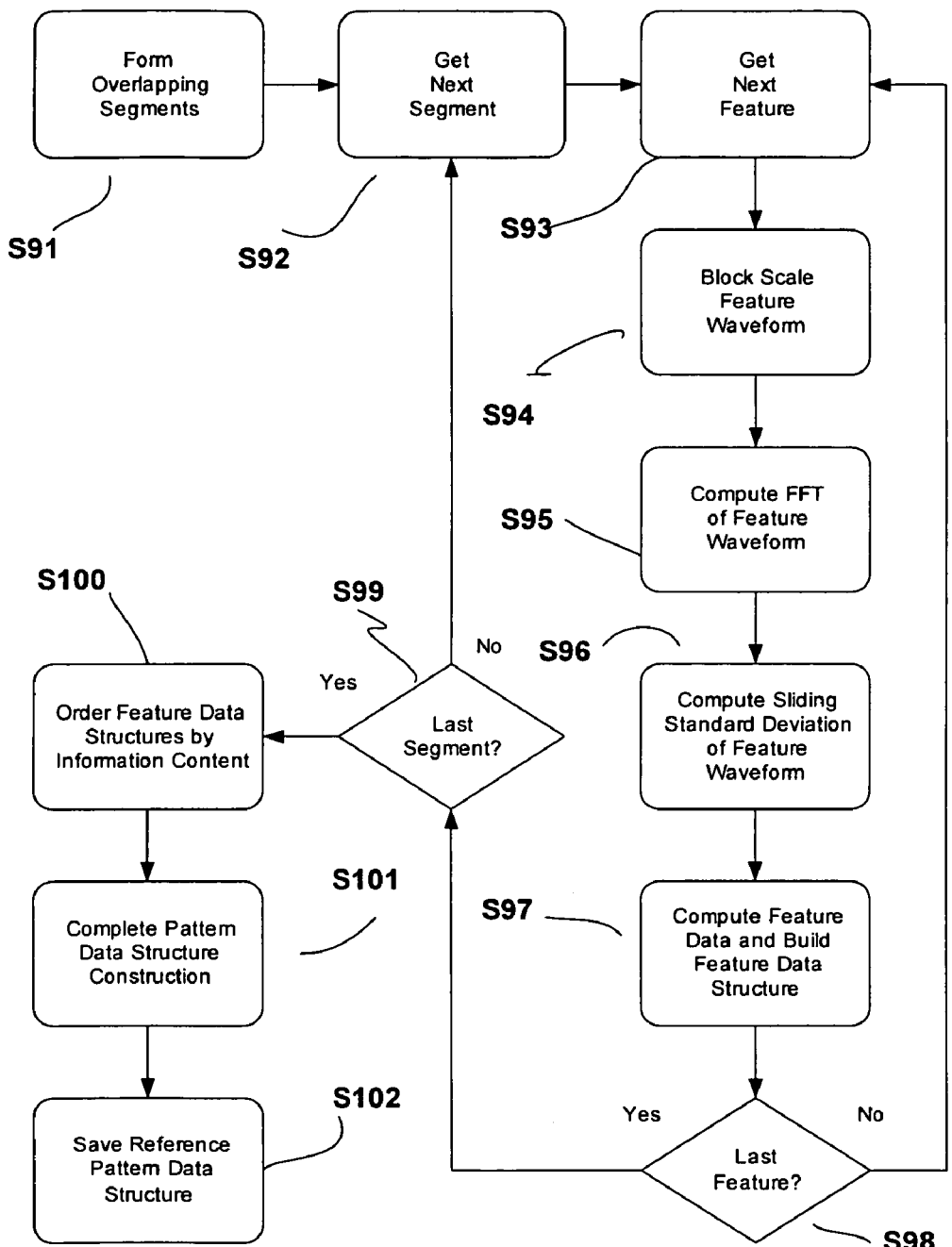
FIG. 9 shows the signal processing steps that are preferably used to generate a reference pattern data structure from the feature time series waveforms.

The procedure for generating reference patterns is illustrated in FIG. 9. FIG. 9 shows the signal processing steps that are preferably used to generate a reference pattern data structure from the feature time series waveforms. First, the features from the entire work are grouped into a sequence of overlapping time segments in Step S91. Each feature from each segment is then block-scaled to a fixed total power in Step S94. The scaled feature is then processed by a Fast Fourier Transform (FFT) in Step S95 to produce the complex spectrum. The sliding standard deviation of the scaled feature is also computed over an interval equal to half of the segment length in Step S96. The individual data structures representing each feature of each segment are then constructed in Step S97. When all features of all segments have been processed (via Steps S92, S93, S98, and S99, the features within each segment are rank-ordered according to their information content in Step S100. The top level of the pattern data structure is then constructed in Step S101, and the reference pattern data structure is saved in Step S102. In more detail, for each feature of each segment, the feature waveform is first block-scaled to a fixed total power. This assures that the precision and dynamic range of the signal processing is preserved. The scale factor used in this scaling is saved. Next the Fast Fourier Transform (FFT) of the feature waveform is computed, yielding the complex spectrum that is used in the fast correlation algorithm. A sliding standard deviation (RMS) of the feature waveform is also computed for use in properly normalizing the correlation functions. In the preferred embodiment of the invention the standard deviation is calculated for each of 64 positions within a 128 sample segment using a window that is 64 samples long. Once all features of all segments have been processed as described above, the information content of each feature from each segment is measured. The measure of information content used in the preferred embodiment is the degree of spectral dispersion of energy in the power spectrum of each feature. This can be statistically estimated from the second moment of the power spectrum. Features with widely dispersed energy have more complex structure and are therefore more distinctive in their ability to discriminate among different patterns. The features within each segment are then rank-ordered by their information content so that the most useful features will be used first in the pattern recognition process. Features with too little information to be useful are deleted from the reference pattern data structure. Next, the detection parameters are computed. Each feature is correlated with a large number of pattern samples that do not match the pattern under consideration. The statistical distribution that results characterizes the false alarm behavior of the feature. Acceptable detection and rejection probabilities are then computed from the joint probability of false alarm. These are stored as detection and rejection thresholds to be used in the pattern recognition process.

Figure 10:
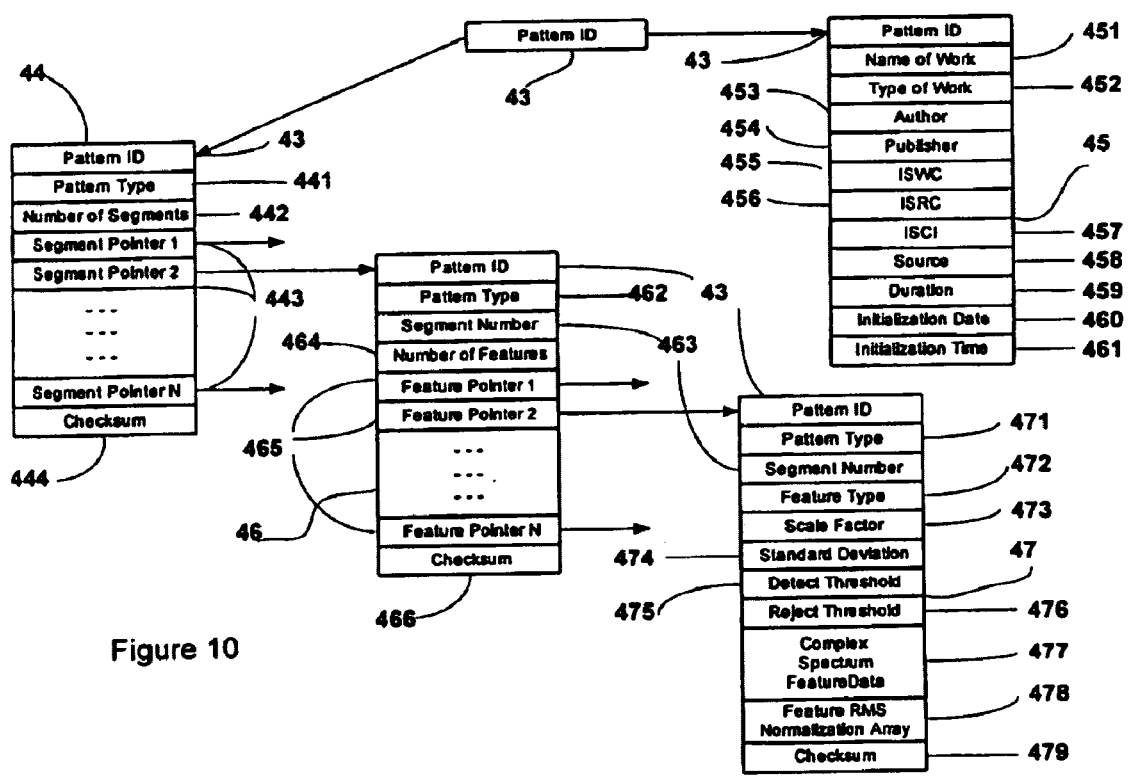
FIG. 10 illustrates the preferred structure of a database reference pattern entry.

The reference pattern database structure of the preferred embodiment is illustrated in FIG. 10. This structure contains two types of information, both of which are indexed by a unique Pattern Identification Code 43. The first is a descriptive data record 45 that contains administrative information such as the name 451, type 452, author 453, and publisher 454 of the work. Also included are various industry standard identification codes and data that describe the source media and initialization time and date. The pattern identification code is also included in this record to allow cross-checking of the database, such as the ISWC 455, the ISRC 456, the ISCI 457, the source 458, the duration 459, the initialization date 460, and the initialization time 461. FIG. 10 illustrates the preferred structure of a database reference pattern entry. The reference pattern identification code 43 may be used for both the reference pattern data structures and a data structure that describes the work. The reference pattern data structure includes a list of pointers to segment descriptors. Each segment descriptor contains pattern and segment identification codes and a list of pointers to feature structures. Each feature structure comprises pattern, segment, and feature identification codes and the pattern data itself. Included in the pattern data are the scale factor used to normalize the data, the standard deviation of random correlations, a detection probability threshold, and a rejection probability threshold. After these parameters are the complex spectrum of feature time series and the sliding standard deviation (RMS) of the feature time series. Each component of the overall data structure may also contain a checksum to validate data integrity.

The second part of the preferred database is a hierarchical set of data structures that contain the reference pattern data itself plus the information needed to process the data. At the top of this hierarchy is the Pattern Descriptor Block 44. This block contains the pattern identification code 43 to allow integrity checking of the database and the pattern type 441. Next is a number that indicates the number of segments 442 in the pattern and a set of pointers 443 to Segment Descriptor Blocks 46. A checksum 444 may also be included to verify the integrity of the block. The Segment Descriptor Blocks 46 contain the pattern identification code 43, pattern type 462, and segment number 463 to verify the integrity of the data structures. Next are the number of features 464, a list of pointers 465 to feature blocks, and an optional checksum 466. Each Feature Block 47 contains the pattern identification code 43, pattern type 471 (audio, video, mixed, etc.), segment number 463, and feature type 472 (audio, video, etc.). Next is the scale factor 473 that was used to block scale the feature waveform during initialization followed by the standard deviation 474 of background (false) correlations that was computed from the false alarm correlation distribution. The detection and rejection probability thresholds 475 and 476, respectively are included next. These are used to determine whether a detection can be confirmed, a false alarm can be confirmed, or if another feature must be evaluated in order to decide. The complex spectrum 477 of the feature data is included next, followed by the sliding standard deviation (RMS) 478 of the feature waveform that is used to normalize the raw correlation functions. A checksum 479 may also be included.

Figure 11:
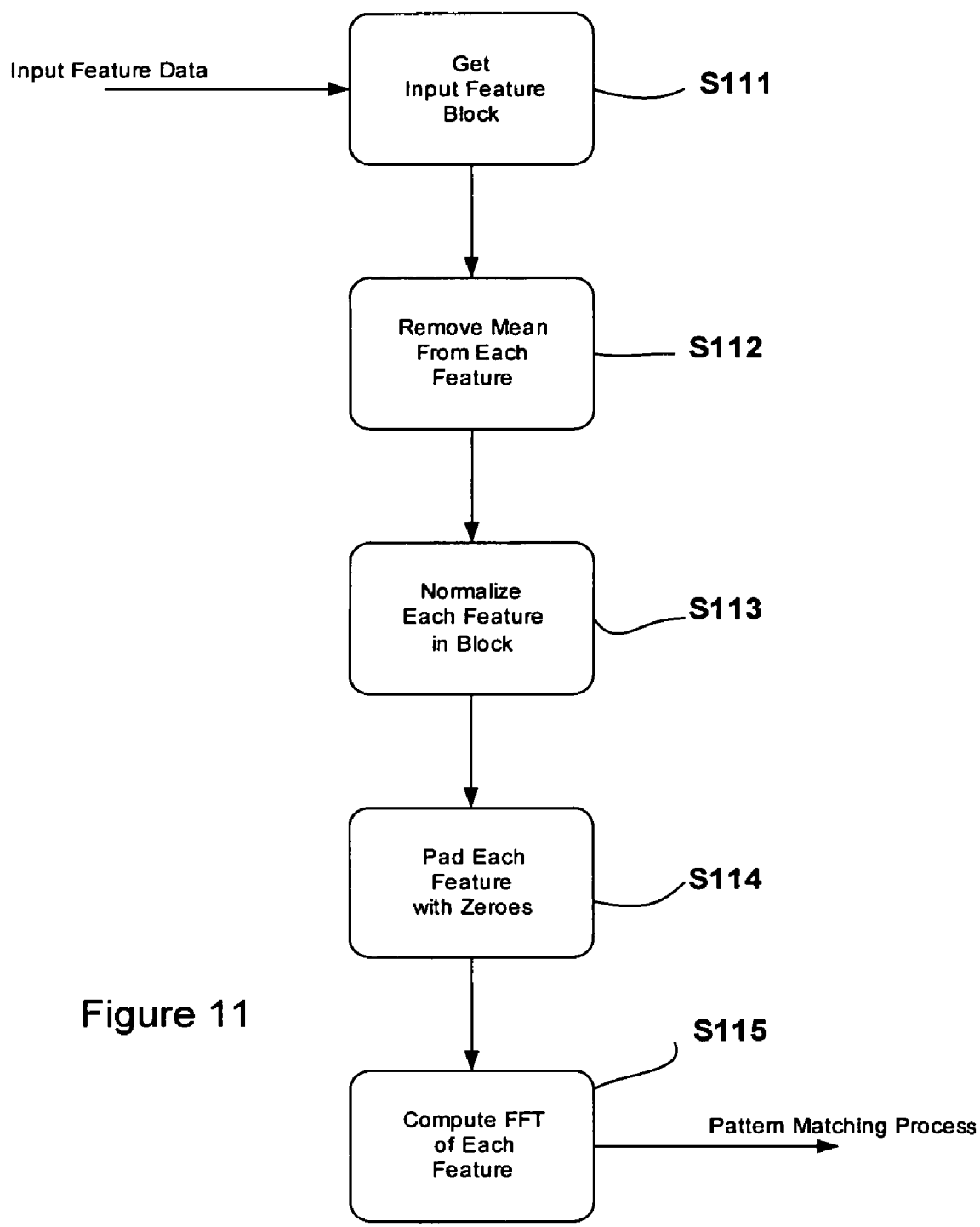
FIG. 11 illustrates the preferred preprocessing of features that may occur prior to real-time pattern recognition.

FIG. 11 illustrates the preferred real-time feature preprocessing that may occur prior to real-time pattern recognition. A new block of feature data is acquired in Step S1 and the mean is removed from each feature in Step S112. Each feature is then normalized in Step S113 to fixed total power. The normalized feature blocks are then padded in Step S114 to double their length by appending zeros. The Fast Fourier Transform of each feature block is then computed in Step S115 to produce the complex spectrum. In more detail, FIG. 11 identifies the steps that are used to prepare a new input feature block for pattern recognition. The raw input feature set comprises a set of time series waveforms representing captured samples. First, the mean value of each feature is removed. Next, each feature in the input block is normalized by dividing each feature data value by the standard deviation calculated over the entire block. Each normalized feature time series is then padded with zeros to double its duration. This is a preferred step in the fast correlation process to prevent circular time wrapping of data values from distorting correlation values. The fast Fourier transform (FFT) of each feature is then computed, producing a complex spectrum.

Figure 12:
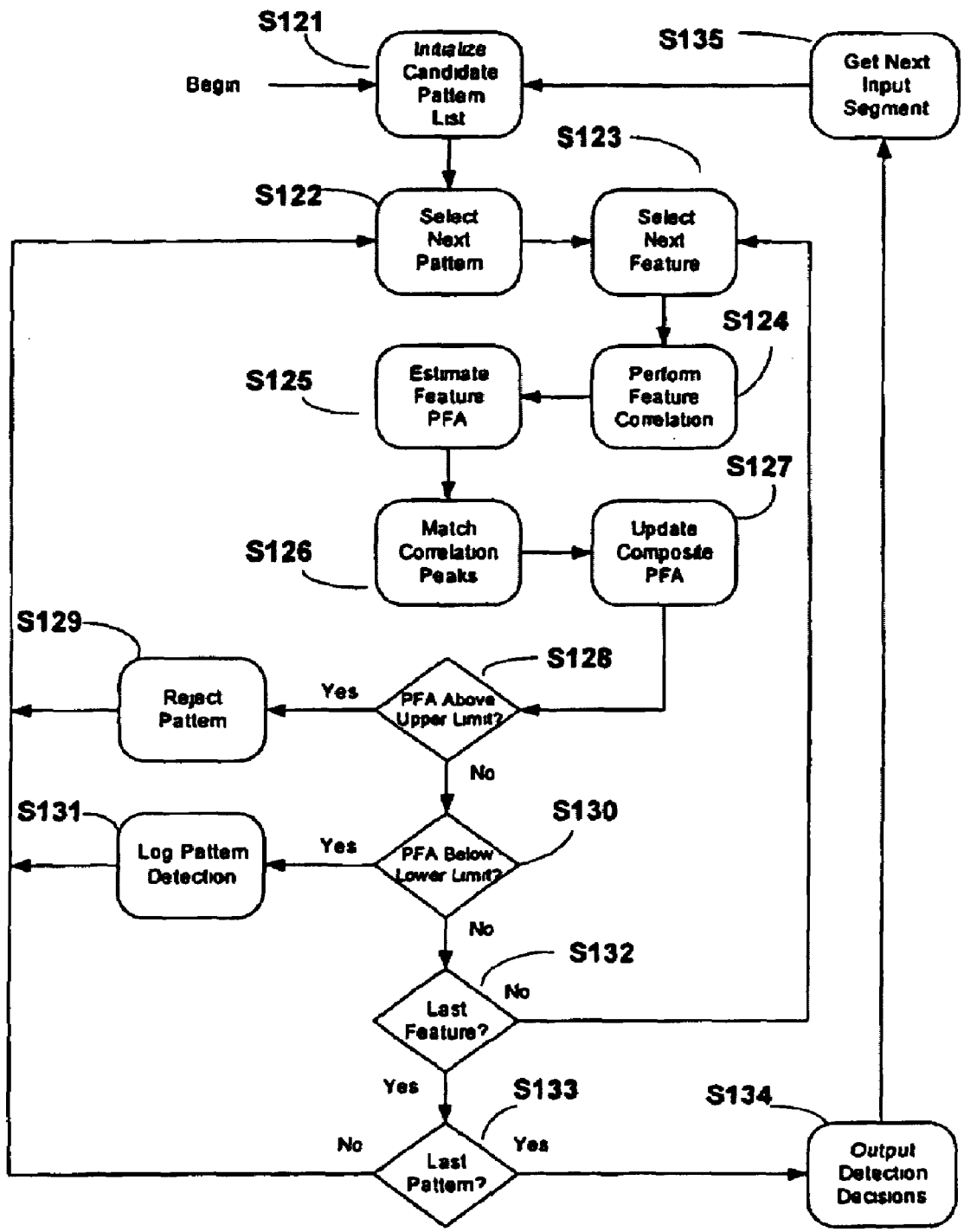
FIG. 12 shows the preferred strategy and procedure used to identify a work using a subset of available features.

FIG. 12 shows the preferred strategy and procedure used to identify a work using a subset of available features. Briefly, the unknown input feature block is compared with each segment of a particular work. For each segment of a work, features are evaluated sequentially according to their information content. The probability of false alarm is estimated each time new information is added. Detection/rejection decisions are made on the basis of two sets of probability thresholds. In more detail, the pattern recognition processes employed in the preferred embodiment of the invention are illustrated in the multiple feature correlation process shown in FIG. 12. When a new input feature block is acquired, it is compared with candidate patterns on one or more of the reference pattern lists. After initializing this list in Step S121 to access the next pattern to be evaluated in Step S122, the first feature is selected from both the unknown input and the reference pattern in Step S123. The cross-correlation function is then computed in Step S124. The correlation function has a value of one for a perfect match, zero for no correlation, and negative one for a perfect anti-correlation. The maximum value of the correlation function is then found. Next the correlation peak value is divided by the standard deviation of background (false) correlations that was found in the initialization process to yield the number of standard deviations from the mean value of zero. Using Gaussian statistics, an estimate the probability that this event occurred randomly (a false alarm) can be determined in Step S125, and correlation peaks are matched in Step S126. The process is repeated for subsequent features at the same instant of time. The resulting probabilities of false alarm for the individual features are multiplied to produce a composite false alarm probability in Step S127. The composite probability of false alarm (PFA) is then compared with an upper limit in Step S128. If the composite PFA exceeds this limit, the candidate detection is deemed to be a false alarm and the pattern is rejected in Step S129. Otherwise, the composite PFA is compared with a lower limit in Step S130.

If the composite PFA is less than the lower limit in Step S130, the probability that the event is due to random events is deemed to be sufficiently low that the event must be a legitimate pattern recognition. The detection event is then logged in Step S131 along with the time and date of its occurrence and the channel number or source. Additional information regarding the remaining time in the recording is passed to the scheduler to allow it to make more efficient scheduling plans. If the composite PFA is above the lower limit in Step S130 and is below the upper limit in Step S128, the cause of the event is still uncertain and requires the use of additional information from other features. This process of correlating, estimating individual feature PFA's, updating the composite PFA, and evaluating the composite PFA is repeated via Steps S132 and S133 until a decision can be made in Step S134 and the next segment can be obtained in Step S135. Note that a new pair of PFA limits is used each time that a new feature is added. In addition, the upper and lower PFA limits for the last available feature are set to be equal to force a decision to be made. The above processes are repeated for all time segments of all patterns on the candidate pattern list. This could result in simultaneous detections of two or more patterns. If such simultaneous detections occur, this could indicate that one work or recording is a composite of other initialized works.

Figure 13:
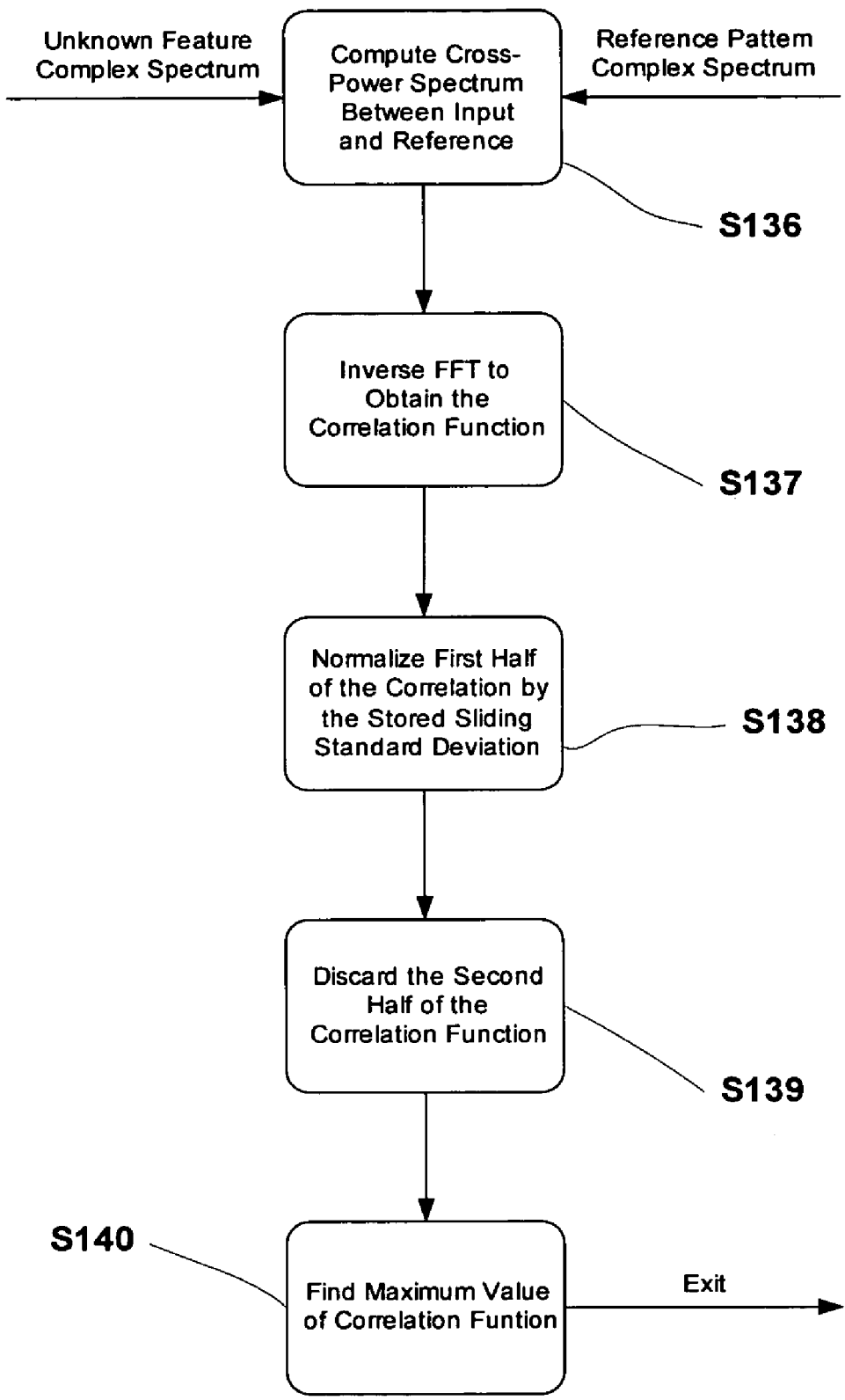
FIG. 13 illustrates the preferred feature correlation process between an unknown feature complex spectrum and a candidate reference pattern complex spectrum.

FIG. 13 illustrates the preferred feature correlation process between an unknown feature complex spectrum and a candidate reference pattern complex spectrum. Briefly, the cross-power spectrum is first computed prior to computing the inverse FFT, yielding a cross-correlation function. The first half of this is normalized by the sliding standard deviation. The second half of the correlation functions contains circularly wrapped values and is discarded. FIG. 13 illustrates the steps in performing the fast correlation algorithm using the complex spectra of the feature waveforms from the unknown input and an initialized reference pattern from the database. These spectra are first multiplied to produce the complex cross-power spectrum in Step 136. The Inverse Fast Fourier Transform is then applied to the cross-spectrum to obtain a raw correlation function in Step S137. The first half of this correlation function is then normalized in Step S138 by the sliding standard deviation (RMS) previously computed during initialization and stored in the feature structure of the pattern database. The second half of the correlation function represents circularly time-wrapped values that are discarded in Step S139, and the maximum value of the correlation function is found in Step S140. An example of a properly normalized feature correlation is shown in FIG. 14.

Figure 15A:
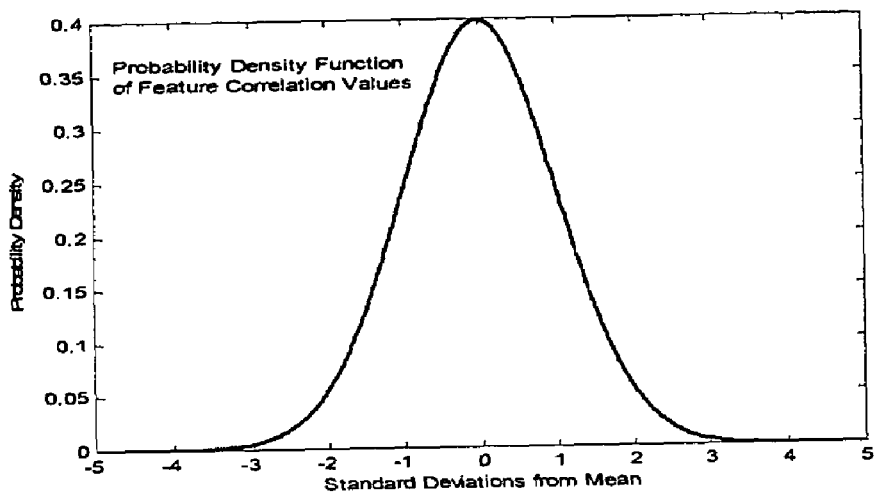
FIGS. 15(A), 15(B), and 15(C) illustrate how false detection probabilities are derived from a distribution of random correlation values.
Figure 15B:
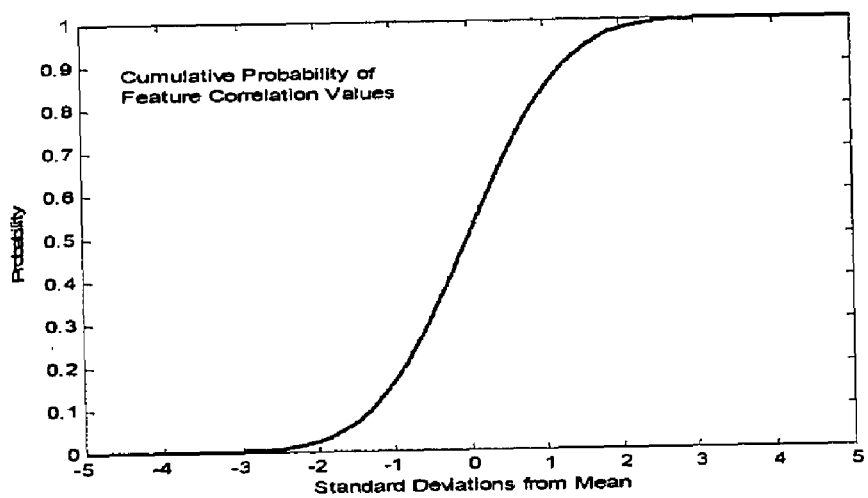
Figure 15C:
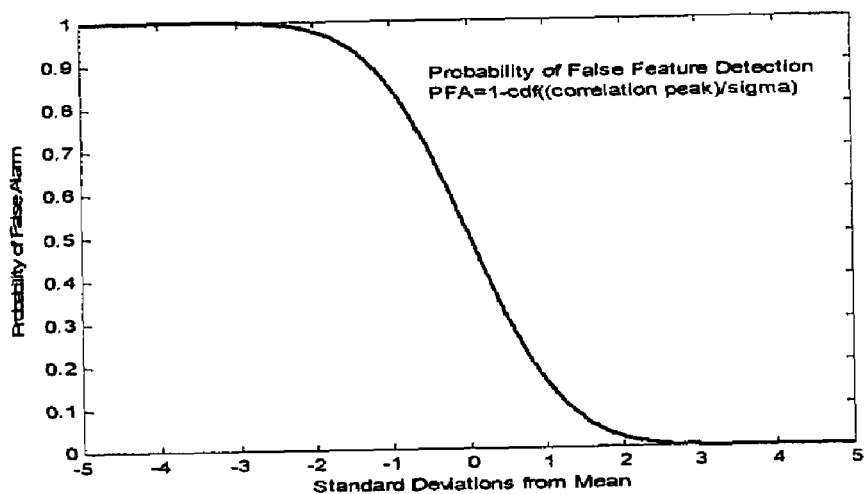

FIGS. 15(A), 15(B), and 15(C) illustrate how false detection probabilities are derived from a distribution of random correlation values. As shown in FIG. 15(A), the probability density function of mismatched correlation values is estimated for a large group of background patterns during initialization. The cumulative distribution function shown in FIG. 15(B) is then estimated by integrating FIG. 15(A). Finally, the probability of false alarm is estimated by subtracting the cumulative distribution function from one as shown in FIG. 15(C). In more detail, these figures illustrate how false detection probabilities can be estimated from the feature correlation values and the standard deviation of background (false) correlations calculated during initialization. It has been found that the distribution of random correlations is approximately normal resulting in a probability density function resembling FIG. 15(A). In the preferred embodiment of the invention, the correlation values are divided by the standard deviation of background correlations. This yields the number of standard deviations from the expected value. The cumulative distribution function shown in FIG. 15(B) indicates the probability that a correlation value expressed in standard deviations will encompass all legitimate detections. For example, if the standard deviation of background correlations was found to be 0.3 during initialization and we compute a correlation value of 0.6 during pattern recognition, the correlation value is 2 standard deviations above the expected (mean) value for all correlations. From FIG. 15(B) we surmise that this correlation value is greater than 97.7 percent of all randomly occurring correlation values. The probability that a random correlation will exceed this value is therefore only 2.3 percent. This is illustrated in FIG. 15(C) where we define the probability of false alarm for an individual feature to be PFA=1−CDF((correlation peak)/sigma). In the preferred embodiment of the invention these probabilities are stored in a table for rapid lookup. Assuming statistical independence of the features, the probability that simultaneous false detections of features will occur is simply the product of the individual probabilities of false alarm.

Persons of ordinary skill in the audio-recognition art will readily perceive that a number of devices and methods may be used to practice the present invention, including but not limited to:

FREE-FIELD AUDIO CAPTURE AND STORAGE. A method and portable apparatus for the selective capture and digital storage of samples of the local audio environment. Either the audio waveform or compressed features of the audio waveform may be stored. The audio capture device contains a microphone, signal conditioning electronics, analog-to-digital converter, digital signal processor, and a memory for storage of captured audio samples.

AUDIO DATA TRANSFER. A method and apparatus for electronically transferring stored audio waveforms or compressed features of audio waveforms from the portable capture device to a central site for identification. This method may utilize the Internet or other data network. Alternatively, a direct connection to a host computer site may be used to transfer audio samples for identification.

FEATURE EXTRACTION. A process for the extraction of recognition features of the audio samples. This process includes measuring the energy in a plurality of frequency bands of the audio signal. Sequences of these measurements represent time series features that are used to construct reference patterns for the pattern database. Similarly processed features from unknown audio samples are used for signal identification.

PATTERN INITIALIZATION. A process for constructing reference patterns from audio features of works to be identified. This process accepts as its input feature time series waveforms from an entire work to be identified. Each feature is then broken into overlapping time segments. The segmented feature time series are normalized to fixed power in each segment of each feature. A sliding standard deviation is calculated for each segment of each feature for use in post-processing feature correlation functions during the recognition process. These data are then formatted into reference pattern data structures for storage in a pattern database.

PATTERN RECOGNITION. A process for comparing the unknown captured audio samples transferred from users with reference patterns stored in the pattern database. The recognition process involves the calculation of correlation functions between features of the unknown audio blocks and corresponding features of works stored in the pattern database. For each correlation function, the probability that it occurred randomly is estimated. Additional features are computed as needed and are iteratively evaluated to determine the joint probability of random false detection. This process is repeated until a detection can be conclusively confirmed or until it can be conclusively rejected. When a captured audio feature block is identified, the name of the work and the artist are reported to the user. Otherwise it will be declared to be unknown.

TRANSACTION MODEL. A method has been devised to allow users to carry a small audio collection device to capture unknown samples of music that are heard on radio, television, or any other source of audio recordings. The unknown audio samples are subsequently electronically transferred to a host computer site. The host computer compares the samples transmitted by the user with patterns stored in a reference pattern library stored on the host. The host computer informs the user of the identity of the unknown work if the identification was successful. Optionally, a brief audio sample may be sent to the user for confirmation of the identity. The user is then given the opportunity to purchase the recording on-line, through the recognition server or another commercial server on the Internet or in the same network. Alternatively, the user may be directed to a local retailer where the recording can be purchased.

3. Conclusion

Thus, what has been described is a methodology and a system which allows users to capture audio samples using a small hand-held device. These samples typically represent free-field audio from unknown songs or other recorded media. Captured audio or audio features are transmitted to a central site for identification. Also described is a method and apparatus to automatically recognize audio performances in an accurate and efficient manner. Optionally, users are provided the opportunity to purchase recordings once they have been identified. The feature signal extraction function can be performed by either the hand-held device or the personal computer. Also, the feature extraction and communication functions may be embodied in software which is uploaded to the hand-held device and/or the personal computer. Likewise, the feature signal extraction and pattern recognition functions may be incorporated into software running on the recognition server.

The individual components shown in the Drawings are all well-known in the signal processing arts, and their specific construction an operation are not critical to the operation or best mode for carrying out the invention.

While the present invention has been described with respect to what is presently considered to be the preferred embodiments, it is to be understood that the invention is not limited to the disclosed embodiments. To the contrary, the invention is intended to cover various modifications and equivalent structures and functions included within the spirit and scope of the described embodiments and overview.

What is claimed is:

1. Apparatus for recognizing free-field audio signals, comprising:
    a hand-held device having a microphone to capture free-field audio signals, the captured free field audio signals corresponding to a portion of a recorded audio work that is less than an entire recorded audio work;
    a local processor, coupleable to said hand-held device, to transmit audio signal features corresponding to the captured free-field audio signals to a recognition site;
    one of said hand-held device and said local processor including circuitry which extracts a time series of spectrally distinct audio signal features from any portion of the captured free-field audio signals, the time series of spectrally distinct audio signal features corresponding to the portion of a recorded audio work that is less than the entire recorded audio work; and
    a recognition processor and a recognition memory at the recognition site, said recognition memory storing data corresponding to a plurality of audio templates, said recognition processor correlating the audio signal features transmitted from said local processor with at least one of the audio templates stored in said recognition processor memory, said recognition processor providing a recognition signal based on the correlation.

2. Apparatus according to claim 1, wherein said hand-held device includes:
    an analog-to-digital converter which digitizes the captured free-field audio signals; and
    a processor which extracts the time series of spectrally distinct audio signal features from the captured free-field audio signals.

3. Apparatus according to claim 1, wherein said local processor extracts the time series of spectrally distinct audio signal features from the captured free-field audio signals.

4. Apparatus according to claim 1, wherein said local processor comprises a personal computer coupled to the Internet.

5. Apparatus according to claim 1, wherein said recognition processor memory stores a plurality of audio templates, each template corresponding to substantially an entire recorded audio work.

6. Apparatus according to claim 5, wherein said hand-held device has a memory which stores free-field audio signals which correspond to less than an entire recorded audio work.

7. Apparatus according to claim 6, wherein the entire recorded audio work comprises a song.

8. Apparatus according to claim 1, wherein said recognition processor, in response to the recognition signal, transmits at least a portion of the at least one template stored in said recognition processor memory to said local processor for verification.

9. Apparatus according to claim 1, wherein said recognition processor mathematically correlates the audio signal features transmitted from said local processor with the at least one of the audio templates stored in said recognition processor memory.

10. A hand-held device for capturing audio signals which correspond to a portion of a recorded audio work that is less than the entire recorded audio work, and providing to a recognition processor extracted feature signals that correspond to the captured audio signals, the recognition processor comparing the received extracted feature signals to a plurality of stored audio works, the hand-held device comprising:
    a microphone configured to receive analog audio signals which correspond to the portion of the recorded audio work that is less than the entire recorded audio work;
    an A/D converter configured to convert the received analog audio signals to digital audio signals which correspond to the portion of the recorded audio work that is less than the entire recorded audio work;
    a signal processor configured to extract a plurality of distinct feature signals from any random portion of the digital audio signals, the extracted feature signals corresponding to the portion of the recorded audio work that is less than the entire recorded audio work;
    a memory configured to store the extracted feature signals; and
    output circuitry configured to output the stored extracted feature signals from said hand-held device.

11. A device according to claim 10, wherein said A/D converter includes an anti-aliasing filter for filtering the received analog audio signals.

12. A device according to claim 10, wherein said memory comprises a flash memory.

13. A device according to claim 10, wherein said signal processor extracts a time series of signals corresponding to energy in a plurality of different frequency bands of the digital audio signals.

14. A device according to claim 10, wherein said signal processor compresses the extracted feature signals, and wherein said memory stores the compressed signals.

15. A device according to claim 10, wherein said hand-held device comprises a cellular telephone.

16. A device according to claim 10, wherein said hand-held device comprises a portable device assistant.

17. A device according to claim 10, wherein said hand-held device comprises a radio receiver.

18. A local processor for an audio signal recognition system having a hand-held device and a recognition server, the hand-held device capturing audio signals and downloading them to the local processor, the recognition server (i) receiving from the local processor extracted feature signals that correspond to the captured audio signals and (ii) comparing received extracted feature signals to a plurality of stored recorded entire audio works, the local processor comprising:
    an interface for receiving the captured audio signals from the hand-held device, the captured audio signals corresponding to a portion of a recorded audio work that is less than the entire recorded audio work;
    a processor for forming extracted feature signals corresponding to the received captured audio signals, the extracted feature signals corresponding to the portion of the recorded audio work that is less than the entire recorded audio work, the extracted feature signals also corresponding to different frequency bands of the captured audio signals;

a memory for storing the extracted feature signals; and
an activation device which causes the stored extracted feature signals to be sent to the recognition server.

19. A processor according to claim 18, further comprising audio structure for playing back to a user a verification signal received from the recognition server, the verification signal corresponding to the captured audio signal.

20. A processor according to claim 18, wherein the local processor sends the extracted feature signals to the recognition server over the Internet.

21. A recognition server for an audio signal recognition system having a hand-held device and a local processor, the hand-held device capturing audio signals and transmitting to the local processor signals which correspond to the captured audio signals, the local processor transmitting extracted feature signals to the recognition server, the recognition server comprising:
an interface receiving the extracted feature signals from the local processor, the extracted feature signals corresponding to a portion of a recorded audio work that is less than the entire recorded audio work;
a memory storing a plurality of feature signal sets, each set corresponding to an entire recorded audio work; and
processing circuitry which (i) receives an input audio stream and separates the received audio stream into a plurality of different frequency bands; (ii) forms a plurality of feature time series waveforms which correspond to spectrally distinct portions of the received input audio stream; (iii) stores in the memory the plurality of feature signal sets which correspond to the feature time series waveforms, (iv) compares the extracted feature signals received by said interface with the stored feature signal sets, and (v) provides a recognition signal when the received extracted feature signals match at least one of the stored feature signal sets.

22. A server according to claim 21, wherein said processing circuitry also (i) forms multiple feature streams from the plurality of feature time series waveforms; (ii) forms overlapping time intervals of the multiple feature streams; (iii) estimates the distinctiveness of each feature in each time interval; (iv) rank-orders the features according to their distinctiveness; (v) transforms the feature time series to obtain the complex spectra; and (viii) stores the feature complex spectra in the memory as the feature signal sets.

23. A server according to claim 21, wherein said interface is coupled to the Internet.

24. A server according to claim 21, wherein said processing circuitry forwards to the local processor, verification audio signals which correspond to the matched at least one stored feature signal sets.

25. A server according to claim 21, wherein said processing circuitry forwards to the local processor, signals which correspond to the matched at least one stored feature signal sets.

26. A method for recognizing an input audio data stream, comprising the steps of:
receiving the input audio data stream with a hand held device;
with the hand held device, randomly selecting any one portion of the received audio data stream, the one portion of the received audio data stream comprising a portion of a recorded audio work that is less than the entire recorded audio work;
forming a first plurality of feature time series waveforms corresponding to spectrally distinct portions of the received audio data stream;
transmitting to a recognition site the first plurality of feature time series waveforms;
storing a second plurality of feature time series waveforms at the recognition site, the second plurality of feature time series waveforms corresponding to the entire recorded audio work;
at the recognition site, correlating the first plurality of feature time series waveforms with the second plurality of feature time series waveforms; and
designating a recognition when a correlation probability value between the first plurality of feature time series waveforms and one of the second plurality of feature time series waveforms reaches a predetermined value.

27. A method for recognizing free-field audio signals, comprising the steps of:
capturing free-field audio signals with a hand-held device having a microphone, the captured free-field audio signals corresponding to a portion of a recorded audio work that is less than an entire recorded audio work;
transmitting signals corresponding to the captured free-field audio signals to a local processor;
transmitting from the local processor to a recognition site, audio signal features which correspond to the signals transmitted from the hand-held device and correspond to the portion of a recorded audio work that is less than an entire recorded audio work;
one of the hand-held device and the local processor extracting a time series of spectrally distinct audio signal features from the captured free-field audio signals;
storing data corresponding to a plurality of audio templates in a memory at the recognition site, each audio template corresponding to substantially an entire recorded audio work;
correlating the audio signal features transmitted from the local processor with at least one of the audio templates stored in the recognition site memory, using a recognition processor; and
providing a recognition signal based on the correlation.

28. A method according to claim 27, wherein said capturing step includes the steps of:
analog-to-digital converting the captured free-field audio signals; and
extracting the time series of spectrally distinct audio signal features from the captured free-field audio signals.

29. A method according to claim 27, wherein said local processor extracts the time series of spectrally distinct audio signal features from the captured free-field audio signals.

30. A method according to claim 27, wherein said local processor comprises a personal computer coupled to the Internet.

31. A method according to claim 27, further comprising the step of storing, in the hand-held device memory, free-field audio signals which correspond to less than an entire audio work.

32. A method according to claim 27, wherein the audio work comprises a song.

33. A method according to claim 27, further comprising the step of the recognition processor, in response to the recognition signal, transmitting at least a portion of the at least one template stored in said recognition processor memory to the local processor for verification.

34. A method according to claim 27, wherein said recognition processor mathematically correlates the audio signal features transmitted from said local processor with the at least one of the audio templates stored in said recognition processor memory.

35. A method for a hand-held device to capture audio signals to be transmitted from a network computer to a recognition site, the recognition site having a processor which receives extracted feature signals that correspond to the captured audio signals and compares them to a plurality of stored audio information, each of the plurality of stored audio information corresponding to substantially an entire audio work, the method comprising the steps of:
    receiving analog audio signals with a microphone;
    A/D converting the received analog audio signals to digital audio signals, the digital audio signals corresponding to a portion of a recorded audio work that is less than the entire recorded audio work;
    extracting spectrally distinct feature signals from the digital audio signals with a signal processor;
    storing the extracted feature signals in a memory; and
    transmitting the stored extracted feature signals to the network computer through a terminal.

36. A method according to claim 35, wherein the step of A/D converting includes the step of anti-alias filtering the received analog audio signals.

37. A method according to claim 35, wherein said memory comprises a flash memory.

38. A method according to claim 35, wherein said signal processor extracts a time series of signals corresponding to energy in a plurality of different frequency bands of the digital audio signals.

39. A method according to claim 35, wherein said signal processor compresses the extracted feature signals, and wherein said memory stores the compressed signals.

40. A method according to claim 35, wherein said hand-held device comprises a cellular telephone.

41. A method according to claim 35, wherein said hand-held device comprises a personal digital assistant.

42. A method according to claim 35, wherein said hand-held device comprises a radio receiver.

43. A local processor method in an audio signal recognition system having a hand-held device and a recognition server, the hand-held device capturing audio signals and downloading them to the local processor, the captured audio signals corresponding to a portion of a recorded audio work that is less then the entire audio work, the recognition server (i) receiving from the local processor extracted feature signals that correspond to the captured audio signals and (ii) comparing received extracted feature signals to a plurality of stored audio information, each of the plurality of stored audio information corresponding to substantially an entire recorded audio work, the method comprising the steps of:
    receiving the captured audio signals from the hand-held device through an interface, the received audio signals corresponding to the portion of a recorded audio work that is less then the entire audio work;
    forming extracted feature signals corresponding to the received audio signals with a processor, the extracted feature signals corresponding to different frequency bands of the captured audio signals;
    storing the extracted feature signals in a memory; and
    causing the stored extracted feature signals to be sent to the recognition server.

44. A method according to claim 43, further comprising the step of playing back to a user at the local processor, a verification signal received from the recognition server, the verification signal corresponding to the captured audio signal.

45. A method according to claim 43, wherein the local processor sends the extracted feature signals to the recognition server over the Internet.

46. A recognition server method in an audio signal recognition system having a hand-held device and a local processor, the hand-held device capturing audio signals and transmitting to the local processor signals which correspond to the captured audio signals, the local processor transmitting extracted feature signals to the recognition server, the method comprising the steps of:
    receiving the extracted feature signals from the local server through an interface, the received extracted feature signals corresponding to a portion of a recorded audio work that is less than an entire recorded audio work;
    storing a plurality of feature signal sets in a memory, each set corresponding to an entire recorded audio work; and
    with processing circuitry (i) receiving an input audio stream and separating the received audio stream into a plurality of different frequency bands; (ii) forming a plurality of feature time series waveforms which correspond to spectrally distinct portions of the received input audio stream; (iii) storing in the memory the plurality of feature signal sets which correspond to the feature time series waveforms, (iv) comparing the received feature signals, which correspond to the portion of a recorded audio work that is less than the entire audio work, with the stored feature signal sets, each of which corresponds to an entire audio work, and (v) providing a recognition signal when the received feature signals match at least one of the stored feature signal sets.

47. A method according to claim 46, wherein said processing circuitry also (i) forms multiple feature streams from the plurality of feature time series waveforms; (ii) forms overlapping time intervals of the multiple feature streams; (iii) estimates the distinctiveness of each feature in each time interval; (iv) rank-orders the features according to their distinctiveness; (v) transforms the feature time series to obtain the complex spectra; and (vi) stores the feature complex spectra in the memory as the feature signal sets.

48. A method according to claim 46, wherein said interface is coupled to the Internet.

49. A method according to claim 46, wherein said processing circuitry forwards to the local processor, verification audio signals which correspond to the matched at least one stored feature signal sets.

50. A method according to claim 46, wherein said processing circuitry forwards to the local processor, signals which correspond to the matched at least one stored feature signal sets.

51. Computer readable storage media storing code which causes one or more processors to carry out a method for recognizing an input audio data stream, the code causing the one or more processors to perform the steps of:
    receiving the input data stream with a hand held device;
    with the hand held device, randomly selecting any one portion of the received audio data stream, the selected portion being less than an entire recorded audio work;
    forming a first plurality of feature time series waveforms corresponding to spectrally distinct portions of the selected portion;
    transmitting to a recognition site the first plurality of feature time series waveforms;
    storing a second plurality of feature time series waveforms at the recognition site, each of the second plurality of time series waveforms corresponding to substantially an entire recorded audio work;

at the recognition site, correlating the first plurality of feature time series waveforms with the second plurality of feature time series waveforms; and designating a recognition when a correlation probability value between the first plurality of feature time series waveforms and one of the second plurality of feature time series waveforms reaches a predetermined value.

52. Computer readable storage media storing code which causes one or more processors to carry out a method for recognizing free-field audio signals, the code causing the one or more processors to perform the steps of:

capturing free-field audio signals with a hand-held device having a microphone;

transmitting signals corresponding to the captured free-field audio signals to a local processor, the transmitted signals corresponding to a portion of a recorded audio work that is less than an entire recorded audio work;

transmitting from the local processor to a recognition site, audio signal features which correspond to the signals transmitted from the hand-held device, the transmitted audio signal features corresponding to the portion of a recorded audio work that is less than an entire recorded audio work;

at least one of the hand-held device and the local processor extracting a time series of spectrally distinct audio signal features from the captured free-field audio signals;

storing data corresponding to a plurality of audio templates in a memory at the recognition site, each of the audio templates corresponding to substantially an entire recorded audio work;

correlating the audio signal features transmitted from the local processor with at least one of the audio templates stored in the recognition site memory, using a recognition processor; and providing a recognition signal based on the correlation.

53. Computer readable storage media according to claim 52, wherein said code includes code for causing the one or more processors to perform the steps of:

analog-to-digital converting the captured free-field audio signals; and extracting the time series of spectrally distinct audio signal features from the captured free-field audio signals.

54. Computer readable storage media according to claim 52, wherein said code includes code for causing the said local processor to extract the time series of spectrally distinct audio signal features from the captured free-field audio signals.

55. Computer readable storage media according to claim 52, wherein said local processor comprises a personal computer coupled to the Internet.

56. Computer readable storage media according to claim 52, wherein the audio work comprises a song.

57. Computer readable storage media according to claim 52, further comprising code for causing the recognition processor, in response to the recognition signal, to transmit at least a portion of the at least one template stored in said recognition processor memory to the local processor for verification.

58. Computer readable storage media according to claim 52, further comprising code for causing said recognition processor to mathematically correlate the audio signal features transmitted from said local processor with the at least one of the audio templates stored in said recognition processor memory.

59. Computer readable storage media storing code which causes a hand-held device to capture audio signals to be transmitted from a network computer to a recognition site, the recognition site having a processor which receives extracted feature signals that correspond to the captured audio signals and compares them to a plurality of stored entire recorded audio works, the code causing the hand-held device to perform the steps of:

receiving analog audio signals with a microphone;

A/D converting the received analog audio signals to digital audio signals;

extracting spectrally distinct feature signals from the digital audio signals with a signal processor, the extracted feature signals corresponding to a portion of a recorded audio work that is less than an entire audio work;

storing the extracted feature signals in a memory; and transmitting the stored extracted feature signals to the network computer through a terminal.

60. Computer readable storage media according to claim 59, wherein the code causes said signal processor to extract a time series of signals corresponding to energy in a plurality of different frequency bands of the digital audio signals.

61. Computer readable storage media according to claim 59, wherein said code causes said signal processor to compress the extracted feature signals, and wherein said code causes said memory to store the compressed signals.

62. Computer readable storage media according to claim 59, wherein said hand-held device comprises a cellular telephone.

63. Computer readable storage media according to claim 59, wherein said hand-held device comprises a personal digital assistant.

64. Computer readable storage media according to claim 59, wherein said hand-held device comprises a radio receiver.

65. Computer readable storage media storing code which causes a local processor to transmit extracted feature signals to a recognition server, in an audio signal recognition system having a hand-held device and the recognition server, the hand-held device capturing audio signals and downloading them to the local processor, the recognition server (i) receiving from the local processor extracted feature signals that correspond to the captured audio signals and (ii) comparing received extracted feature signals to a plurality of stored recorded audio works, each stored recorded audio work comprising an entire recorded audio work, the code causing the local processor to perform the steps of:

receiving the captured audio signals from the hand-held device through an interface;

forming extracted feature signals corresponding to the received captured audio signals with a processor, the extracted feature signals corresponding to different frequency bands of the captured audio signals, the extracted feature signals corresponding to a portion of a recorded audio work that is less than an entire recorded audio work;

storing the extracted feature signals in a memory; and causing the stored extracted feature signals to be sent to the recognition server.

66. Computer readable storage media according to claim 65, wherein the code causes the local processor to play back to a user at the local processor, a verification signal received from the recognition server, the verification signal corresponding to the captured audio signal.

67. Computer readable storage media according to claim 65, wherein said processor forms the extracted feature signal from less than an entire recorded song.

68. Computer readable storage media according to claim 65, wherein code causes the local processor to send the extracted feature signals to the recognition server over the Internet.

69. Computer readable storage media storing code which causes a recognition server to recognize signals in an audio signal recognition system having a hand-held device and a local processor, the hand-held device capturing audio signals and transmitting to the local processor signals which correspond to the captured audio signals, the local processor transmitting extracted feature signals to the recognition server, the code causing the recognition server to perform the steps of:

receiving the extracted feature signals from the local processor through an interface, the extracted feature signals corresponding to a portion of a recorded audio work that is less than an entire recorded audio work;

storing a plurality of feature signal sets in a memory, each set corresponding to an entire recorded audio work; and with processing circuitry (i) receiving an input audio stream and separate the received audio stream into a plurality of different frequency bands; (ii) forming a plurality of feature time series waveforms which correspond to spectrally distinct portions of the received input audio stream; (iii) storing in the memory the plurality of feature signal sets which correspond to the feature time series waveforms, each of the plurality of feature signal sets corresponding to an entire recorded audio work, (iv) comparing the received extracted feature signals with the stored feature signal sets, and (v) providing a recognition signal when the received extracted feature signals match at least one of the stored feature signal sets.

70. Computer readable storage media according to claim 69, wherein said code causes said processing circuitry to also (i) form multiple feature streams from the plurality of feature time series waveforms; (ii) form overlapping time intervals of the multiple feature streams; (iii) estimate the distinctiveness of each feature in each time interval; (iv) rank-order the features according to their distinctiveness; (v) transform the feature time series to obtain the complex spectra; and (vi) store the feature complex spectra in the memory as the feature signal sets.

71. Computer readable storage media according to claim 69, wherein said code causes said interface to receive extracted feature signals which comprise less than an entire recorded song.

72. Computer readable storage media according to claim 69, wherein said code causes said processor to forward to the local processor, verification audio signals which correspond to the matched at least one stored feature signal sets.

73. Apparatus for recognizing free-field audio signals, comprising:

a hand-held device having a microphone to capture free-field audio signals;

a local transmitter, integral to said hand-held device, to transmit a signal corresponding to the captured free-field audio signals to a recognition site, the transmitted signal corresponding to a portion of a recorded audio work that is less than an entire recorded audio work;

said local transmitter further comprising an analog-to-digital converter to convert the free-field audio signal to a digital format; and a recognition processor and a recognition memory at the recognition site, said recognition memory storing data corresponding to a plurality of audio templates, each audio template corresponding to substantially an entire recorded audio work, said recognition processor comparing the signal transmitted from said local transmitter with at least one of the audio templates stored in said recognition processor memory, said recognition processor providing a recognition signal based on the comparison.

74. The apparatus of claim 73 further comprising a local receiver integral to said hand-held device for receipt of said recognition signal.

75. The apparatus of claim 74, wherein said local receiver further comprises a display device to display metadata associated with said recognition signal.

76. The apparatus of claim 75, wherein said metadata comprises at least one selected from the group consisting of song title, album title, author, singer, date of creation, and artist name(s).

77. The apparatus of claim 75, wherein said metadata comprises at least one selected from the group consisting of advertisement ID, advertisement source, advertisement ownership, and advertisement sponsorship.

78. The apparatus of claim 74, wherein said recognition signal is transmitted to said local receiver by a communication protocol selected from the group consisting of frequency division multiple access, time division multiple access, cellular digital packet data, global system for mobile communications, and code division multiple access.

79. The apparatus of claim 73 wherein said local transmitter transmits to said recognition site by a communication protocol selected from the group consisting of frequency division multiple access, time division multiple access, cellular digital packet data, global system for mobile communications, and code division multiple access.

80. The apparatus of claim 73, wherein said hand-held device comprises a cellular phone.

81. The apparatus of claim 73, wherein each said audio template corresponds to at least one of a song, advertisement, TV program, and radio program.

82. The apparatus according to claim 73, wherein said free-field audio signal corresponds to at least one of a radio broadcast signal of a song, a TV program, an advertisement, and a locally generated audio signal.

83. The apparatus according to claim 73, wherein said free-field audio signal is transmitted over the Internet and said free field audio signal corresponds to at least one of a song, a TV show, a video file, an advertisement, and a movie.

84. The apparatus according to claim 73, further comprising a signal filter arranged to substantially reduce or eliminate noise from said free-field audio signal.

85. The apparatus according to claim 84, wherein said signal filter is integral to said hand-held device.

86. The apparatus according to claim 84, wherein said signal filter is coupled to said recognition processor.

87. The apparatus of claim 73, wherein each said audio template uniquely identifies at least one of a song, advertisement, and TV program.

88. The apparatus of claim 73, wherein said recognition memory is a relational database for identification of songs.

89. A method of identifying information associated with an audio signal comprising the steps of:

establishing a connection between a hand-held device and a recognition site;

transmitting a sample signal corresponding to the audio signal over said connection, the sample signal corresponding to a portion of a recorded audio work that is less than an entire recorded audio work;

creating a unique audio template from said sample signal by applying a predetermined algorithm whereby said unique audio template is smaller than said sample signal;

comparing said unique audio template with a plurality of audio signatures stored on said recognition site, said plurality of audio signatures being created by application of said predetermined algorithm to a plurality of predetermined source signals, each of said plurality of audio signatures corresponding to substantially an entire recorded audio work;

determining the identifying information associated with the audio signal based on the comparison of said unique audio template with said plurality of audio signatures; and transmitting the identifying information to said hand-held device over said connection.

90. The method according to claim 89, wherein said audio signal comprises at least one of a broadcast of a song, a TV program, an advertisement, and a locally generated audio signal.

91. The method according to claim 89, wherein said hand-held device comprises a cellular phone.

92. The method according to claim 91, wherein the step of establishing a connection comprises the step of dialing a phone number associated with said recognition site.

93. The method according to claim 91, wherein the step of transmitting a sample signal further comprises the step of placing the microphone of said cellular phone near a source of said audio signal.

94. The method according to claim 89, wherein said source of said audio signal comprises at least one selected from the group consisting of a radio, a TV, a computer, and a local source.

95. The method according to claim 89, wherein said connection is wireless.

96. The method according to claim 89, wherein said recognition site further comprises a relational database associated with said plurality of audio signatures.

97. The method according to claim 89, wherein said predetermined algorithm produces a respective code used to uniquely identify each said audio template.

98. The method according to claim 89, wherein said predetermined algorithm produces a respective code used to uniquely identify each said source signal.

99. The method according to claim 89, wherein said predetermined algorithm produces a respective code used to uniquely identify each said source signal and each said audio template.

100. The method according to claim 89, wherein said connection comprises a communication protocol selected from the group consisting of frequency division multiple access, time division multiple access, cellular digital packet data, global system for mobile communications, and code division multiple access.

101. The method according to claim 89, further comprising the step of filtering out noise associated with said sample signal.

102. The method according to claim 101, wherein the step of filtering out the noise is performed by software code associated with said hand-held device.

103. The method according to claim 101, wherein the step of filtering out the noise is performed by software code associated with said recognition site.

104. The method according to claim 101, wherein the step of filtering out the noise is performed by circuitry associated with said hand-held device.

105. The method according to claim 101, wherein the step of filtering out the noise is performed by circuitry associated with said recognition site.

106. A hand held device for the transmission of a signal corresponding to a free-field audio signal to a recognition site comprising a recognition processor and a recognition memory, the recognition memory adapted to store data corresponding to a plurality of audio templates where each audio template corresponds to substantially an entire recorded audio work, and the recognition processor adapted to compare the signal to at least one of the audio templates, said hand held device comprising:

a receiving means for receipt of the free-field signal;

an analog to digital converter to convert the free-field audio signal to a digital format, the captured free-field audio signal corresponding to a portion of a recorded audio work that is less than the entire recorded audio work; and, a transmitter, integral to said hand-held device, to transmit said signal corresponding to the captured free-field audio signals to the recognition site.

107. The hand held device of claim 106, wherein said receiver means is a microphone.

108. The hand held device of claim 106, further comprising a radio receiver for receipt of a signal caused to be generated by the recognition site.

109. The hand held device of claim 108, further comprising a display means for display of a message associated with the signal caused to be generated by the recognition site.

110. The hand held device of claim 109, wherein said display means comprises an LCD.

111. The hand held device of claim 106, further comprising a signal filter adapted to substantially reduce or eliminate noise from the free-field audio signal.

112. The hand held device of claim 106, wherein transmission of the signal from the hand held device to the recognition site is by a communication protocol selected from the group consisting of frequency division multiple access, time division multiple access, cellular digital packet data, global system for mobile communications, and code division multiple access.

113. A recognition site adapted to process signals corresponding to free field audio signals transmitted from a hand-held device comprising:

a receiving means for receipt of a signal from the hand-held device, the received signal corresponding to a portion of a recorded audio work that is less than an entire audio work;

a memory means for storing a plurality of audio templates, each audio template corresponding to substantially an entire recorded audio work;

a processing means for comparison of said received signal to at least one audio template; and a signal generation means for transmission of a signal to the hand held device corresponding to the comparison performed by said processing means.

114. The recognition site of claim 113, wherein said memory means comprises a database containing a sample signal corresponding to a respective song and metadata associated with said song.

115. The recognition site of claim 114, wherein said metadata comprises at least one of a song title, artist's name, album title, author, singer, and date of creation.

116. The recognition site of claim 113, wherein said memory means comprises a database containing a sample signal corresponding to a respective advertisement and metadata associated with said advertisement.

117. The recognition site of claim 116, wherein said metadata comprises at least one of an advertisement ID, source, sponsorship, and ownership.

118. The recognition site of claim 113, wherein said memory means comprises a database containing a sample signal corresponding to a respective television program and metadata associated with said television program.

119. The recognition site of claim 118, wherein said metadata comprises at least one of a television program title, network, channel number, running time, names of actors, writer, director, producer, and date of creation.

120. The recognition site of claim 113, wherein said processing means comprises a computer executing software code.

121. The recognition site of claim 113, wherein the transmission of the signal to the hand held device is by a communication protocol selected from the group consisting of frequency division multiple access, time division multiple access, cellular digital packet data, global system for mobile communications, and code division multiple access.

122. The recognition site of claim 113 further comprising a signal filter arranged to substantially reduce or eliminate noise.

* * * * *